(12) United States Patent
Mekky et al.

(10) Patent No.: US 10,547,298 B1
(45) Date of Patent: Jan. 28, 2020

(54) DUTY CYCLE CORRECTION SYSTEM AND METHOD

(71) Applicant: Cadence Design Systems, Inc., San Jose, CA (US)

(72) Inventors: Rania Hassan Abdellatif Abdelrahim Mekky, Montreal (CA); Guillaume Fortin, Montreal (CA); Michael Ben Venditti, Montreal (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/124,736

(22) Filed: Sep. 7, 2018

(51) Int. Cl.
*H03K 7/08* (2006.01)
*H03K 19/003* (2006.01)

(52) U.S. Cl.
CPC ......... *H03K 7/08* (2013.01); *H03K 19/00315* (2013.01)

(58) Field of Classification Search
CPC .... H03K 7/08; H03K 19/00315; H03K 3/284; H03K 5/04; H03K 5/1565; H03K 3/017
See application file for complete search history.

(56) References Cited

U.S. PATENT DOCUMENTS

| | | | | |
|---|---|---|---|---|
| 2011/0102039 A1* | 5/2011 | Shin | ......................... | G11C 7/22 327/175 |
| 2011/0163789 A1* | 7/2011 | Na | ......................... | H03K 5/1565 327/175 |
| 2016/0164508 A1* | 6/2016 | Ma | ......................... | H03K 5/12 327/170 |

* cited by examiner

*Primary Examiner* — Long Nguyen
(74) *Attorney, Agent, or Firm* — Mark H. Whittenberger, Esq.; Holland & Knight LLP

(57) ABSTRACT

The present disclosure relates to an apparatus and method for correcting a duty cycle of at least one signal. The apparatus may comprise at least one set of inverters configured to receive the at least one signal and correct the duty cycle of the at least one signal at a correction location of a plurality of correction locations based upon, at least in part, a transmission rate mode of a plurality of transmission rate modes.

19 Claims, 21 Drawing Sheets

DUTY CYCLE CORRECTION SYSTEM AND METHOD

FIELD OF THE INVENTION

The present disclosure relates to serializer/deserializer systems, and more specifically, to a method for duty cycle correction in a SerDes system.

DISCUSSION OF THE RELATED ART

Serializer/deserializer ("SerDes") components are becoming common on integrated System-on-a-chip ("SOC") and Application Specific Integrated Circuits ("ASICs"). The higher demand of high-speed wide-band data rates may require high-speed serial data links (or TX/RX links) that are widely used for sending data over various media, such as cables, board traces and/or backplanes. These media are often referred to as channels. At high speeds, the design of a regular full-rate TX architecture to meet these specifications can be very challenging. For example, a full-rate 32 gigabytes-per-second (Gbps) TX should have a clock frequency of 32 gigahertz (GHz), which can be difficult to generate and achieve the specifications. To achieve higher data rates in modern VLSI systems, half-rate and quarter-rate sampling approaches can be considered to reduce the speed requirement of circuits and power consumption.

There are several circuits that require dual-edge clock sampling to double the data-rate and increase the system bandwidth. Examples of these systems may generally include double sampling analog-to-digital converters, double-data-rate (DDR) SDRAM (DDR3, GDDR5, XDR), half-rate SerDes transmitters (TXs), half-rate clock, and data recovery (CDR), etc. To achieve necessary timing margins in such applications, a 50% duty cycle clock may be needed to achieve the required setup and hold time specifications. In addition, some multi-phase clocking systems, such as quarter-rate SerDes TXs and quarter-rate CDRs, may require a precise 50% duty cycle clock.

However, the duty cycle of a differential clock or other signal can be easily deviated from 50% because of the PVT (i.e., process, voltage, temperature) variations, mismatches in the pull-up and pull-down devices in the buffer chain and different loads, delays in the different clock routings, layout mismatches, etc. Duty cycle deviation from 50% is generally known as duty cycle distortion (DCD). In addition, half-rate or quarter-rate architecture transmitters may require differential (I/Q) clocks with minimum DCD, because it is transferred to the output of the transmitter in the form of periodic jitter that degrades the eye-opening. For these reasons, a real-time correction of the DCD may help overcome these issues.

SUMMARY OF INVENTION

In one embodiment of the present disclosure, an apparatus for correcting a duty cycle of at least one signal is provided. The apparatus may include at least one set of inverters configured to receive the at least one signal and correct the duty cycle of the at least one signal at a correction location of a plurality of correction locations based upon, at least in part, a transmission rate mode of a plurality of transmission rate modes.

One or more of the following features may be included. The at least one set of inverters may include one or more of at least one three-state inverter cell comprising a plurality of NMOS and PMOS transistors and at least one nine-state inverter cell comprising a plurality of NMOS and PMOS transistors. The at least one set of inverters may be configured to correct the at least one output signal at a first correction location during a first transmission rate mode. The first correction location may be at an output of the at least one set of inverters and the first transmission rate mode may be a non-half-rate transmission mode. The at least one set of inverters may be configured to correct the at least one output signal at a second correction location during a second transmission rate mode. The second correction location may be at an input of a transmitter circuit electrically coupled to the at least one set of inverters and the second transmission rate mode may be a half-rate transmission mode. The apparatus may further comprise a controller circuit configured to provide one or more control signals to the at least one set of inverters to correct the duty cycle of the at least one signal at the correction location based upon, at least in part, the transmission rate mode. The controller circuit may be configured to be placed into a hold state for maintaining the value of the one or more control signals. The apparatus may also comprise a plurality of inverters in parallel with the at least one set of inverters. The plurality of inverters may be configured to provide a configurable duty cycle correction range. Disabling at least a portion of the plurality of inverters may increase the duty cycle correction range and enabling at least a portion of the plurality of inverters may decrease the duty cycle correction range.

In another embodiment of the present disclosure, a method for correcting a duty cycle of at least one signal is provided. The method may include receiving, via at least one set of inverters, the at least one signal. The method may further include correcting, via the at least one set of inverters, the duty cycle of the at least one signal at a correction location of a plurality of correction locations based upon, at least in part, a transmission rate mode of a plurality of transmission rate modes.

One or more of the following features may be included. The at least one set of inverters may include one or more of at least one three-state inverter cell comprising a plurality of NMOS and PMOS transistors and at least one nine-state inverter cell comprising a plurality of NMOS and PMOS transistors. The at least one set of inverters may be configured to correct the at least one output signal at a first correction location during a first transmission rate mode. The first correction location may be at an output of the at least one set of inverters and the first transmission rate mode may be a non-half-rate transmission mode. The at least one set of inverters may be configured to correct the at least one output signal at a second correction location during a second transmission rate mode. The second correction location may be at an input of a transmitter circuit electrically coupled to the at least one set of inverters and the second transmission rate mode may be a half-rate transmission mode. The method may further comprise receiving, at a controller circuit, at least one output signal from the at least one set of inverters and providing, via the controller circuit, one or more control signals to the at least one set of inverters to correct the duty cycle of the at least one signal. The controller circuit may be configured to be placed into a hold state for maintaining the value of the one or more control signals. The method may also comprise providing, via a plurality of inverters in parallel with the at least one set of inverters, a configurable duty cycle correction range. The method may further comprise one or more of disabling at least a portion of the plurality of inverters, wherein disabling the at least a portion of the plurality of inverters increases the duty cycle correction range and enabling at least a portion of the plurality of inverters, wherein enabling the at least a portion of the plurality of inverters decreases the duty cycle correction range.

Additional features and advantages of embodiments of the present disclosure may be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Figure 1:
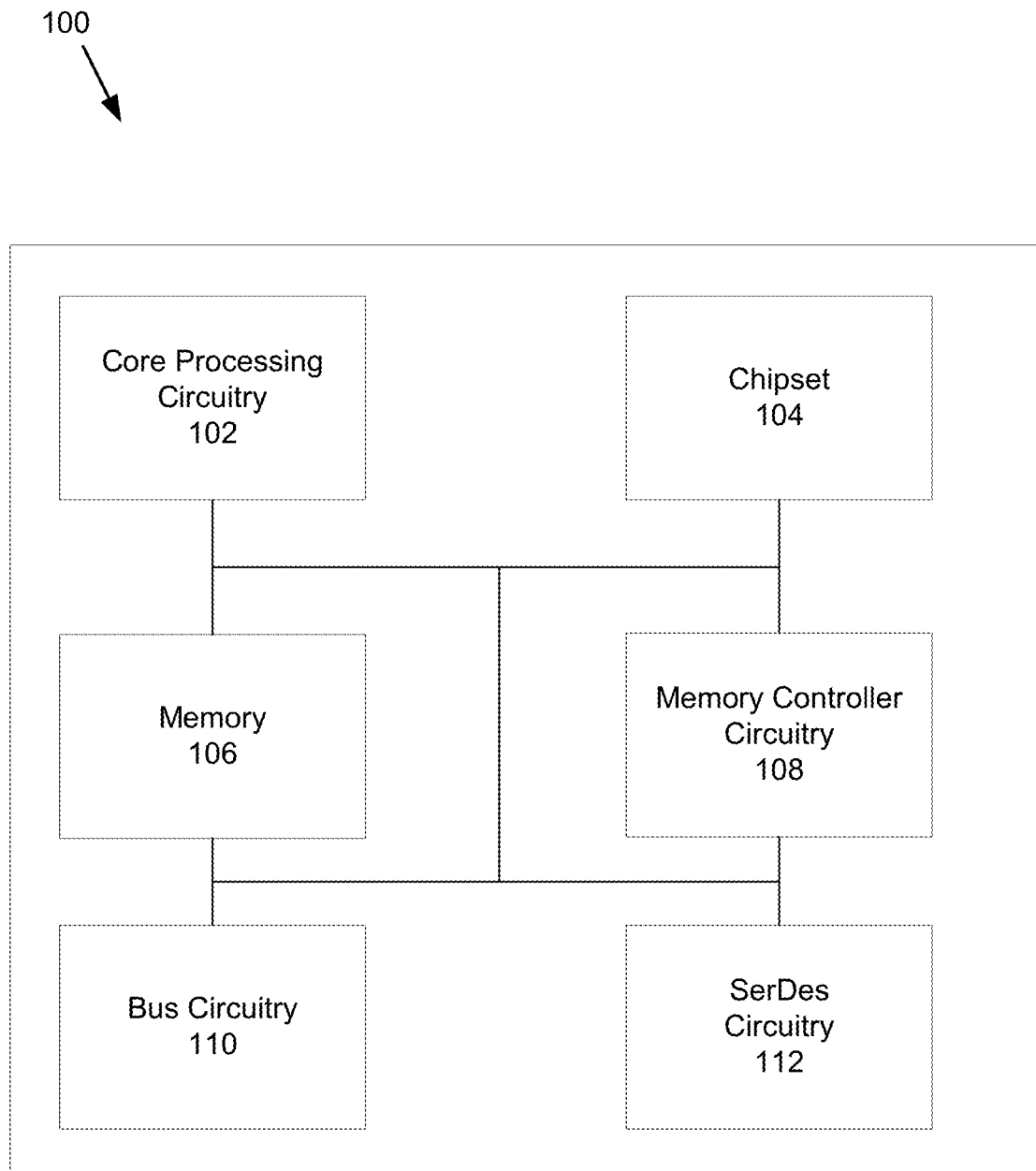
FIG. 1 is a diagram depicting an integrated circuit that may implement an embodiment of a duty cycle correction process in accordance with the present disclosure.

Referring now to FIG. 1, an embodiment of an integrated circuit (IC) 100 in accordance with the present disclosure is shown. The term "integrated circuit", as used in any embodiment herein, may refer to a semiconductor device and/or microelectronic device, such as, for example, but not limited to, a semiconductor integrated circuit chip. The specific configuration, arrangement, and components shown in IC 100 are provided merely for exemplary purposes as additional and/or alternative configurations are also within the scope of the present disclosure.

In some embodiments, IC 100 may include core processing circuitry 102, which may include a variety of different processors such as those known in the art. Any suitable processor may be used without departing from the scope of the present disclosure. IC 100 may also include chipset 104. In some embodiments, chipset 104 may include both Northbridge/memory controller hub (MCH) and Southbridge/PO controller hub (ICH) circuitry. These components may be included within chipset 104 or at any other location within IC 100. IC 100 may also include memory 106, which may be in communication with core processing circuitry 102. Memory 106 may comprise one or more of the following types of memories: semiconductor firmware memory, programmable memory, non-volatile memory, read-only memory, electrically programmable memory, random access memory, flash memory (which may include, for example, NAND or NOR type memory structures), magnetic disk memory, and/or optical disk memory. Either additionally or alternatively, memory may comprise other and/or later-developed types of computer-readable memory. In some embodiments, memory 106 may include, for example, 256 KB of two-way level 2 cache. IC 100 may additionally include memory controller circuitry 108 configured to manage the flow of data to and from memory. For example, in some embodiments, memory controller circuitry 108 may include a double-data-rate two synchronous dynamic random access memory (DDR2 SDRAM) controller. IC 100 may further include bus circuitry 110 configured to provide compatibility with a variety of different bus architectures, including, but not limited to, Universal Serial Bus (USB), Serial Advanced Technology Attachment (SATA), Peripheral Component Interface (PCI), PCI-Express and System Management Bus (SMBus).

IC 100 may also include SerDes circuitry 112, which may include numerous components configured to correct the duty cycle of at least one signal in a SerDes system. Some particular examples of the structure and operations of SerDes circuitry 112 are discussed in further detail hereinbelow.

As will be discussed in greater detail below, embodiments of the present disclosure may address various challenges in conventional signal transmission and SerDes circuitry. For example, high-speed data transmission may require high-frequency clocks and other high-frequency signals. Physically generating a signal or clock at a higher frequency may be more difficult and/or more expensive in terms of hardware design. As such, data sampling configurations such as half-rate, and/or quarter-rate architectures of transmission rates may be used to provide high-speed data transmission while utilizing a slower clock. However, these transmission rates may require a e.g., 50% duty cycle with a low duty cycle error. Additionally, the frequency of the clock or input signal may limit the duty cycle correction range. For example, a tradeoff between duty cycle correction range and output signal jitter may be observed and will be discussed in greater detail below. When various input signals or clocks are received with various frequencies, the ability to correct the duty cycle within a given correction range may be subject to the size of correction steps of a duty cycle correction circuit. For example and as will be discussed in greater detail below, duty cycle correction circuits may include a negative feedback loop to provide incremental adjustments to the duty cycle of a signal or clock. The larger the steps, the more quickly the signal or clock's duty cycle may be corrected. However, larger steps may cause greater jitter in an output signal. As such, employing large steps for low-frequency signals may cause dramatic jitter in the output signal. As will be discussed in greater detail below, embodiments of the present disclosure may address these challenges.

Figure 2:
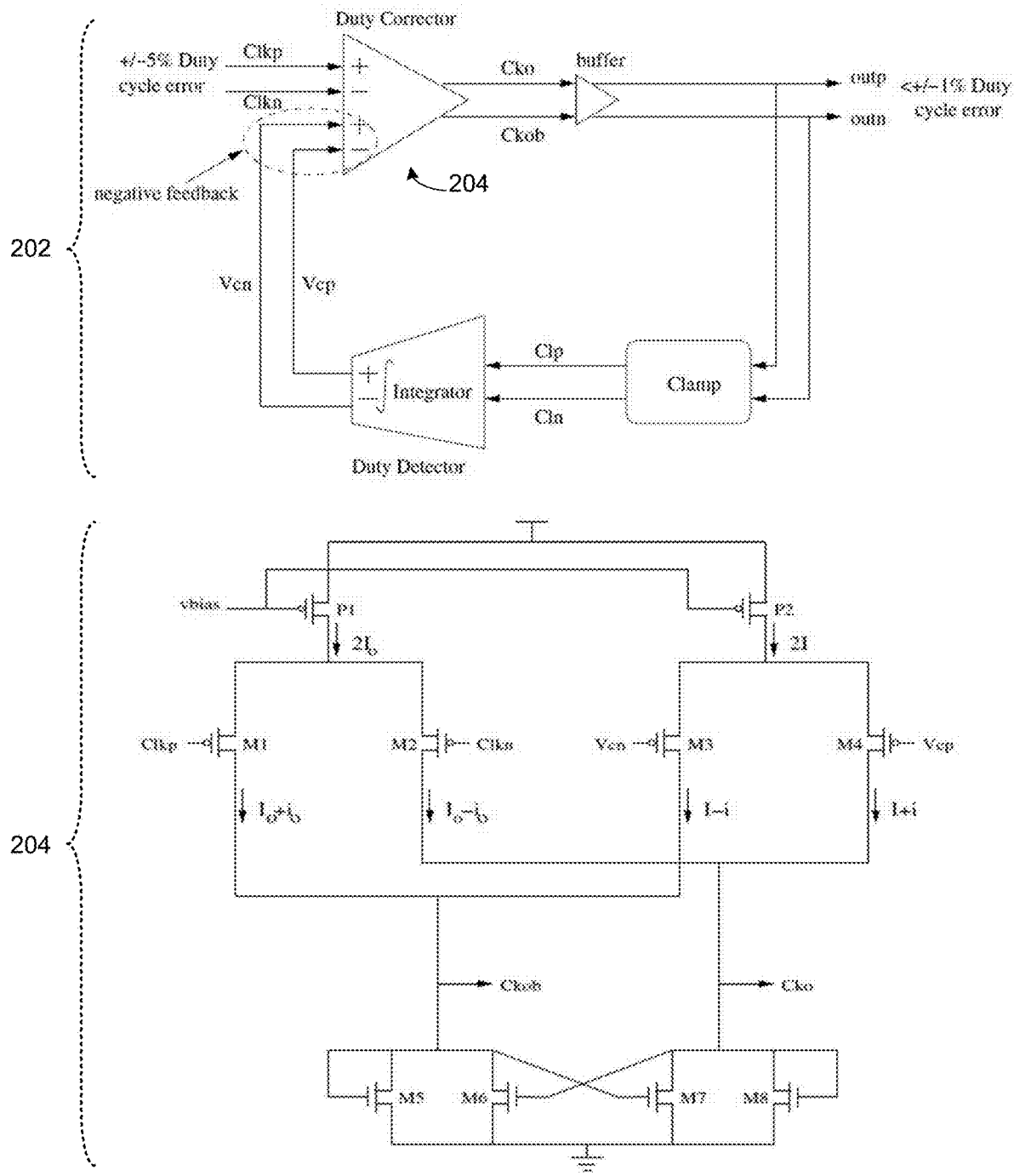
FIG. 2 is a diagram depicting an embodiment of analog duty cycle correction circuitry.

Referring now to FIG. 2, a diagram depicting an example of analog duty cycle correction circuitry 200 is provided. As shown in FIG. 2, analog duty cycle correction circuitry 200 may include an analog feedback loop 202. In this example circuitry, the analog loop 202 may provide negative feedback between a duty cycle corrector circuit 204 based upon a voltage-mode technique. Duty cycle corrector circuit 204 may slow down an edge rate of a differential pair (e.g., transistors M1 and M2) and may add a DC offset by a second differential pair (e.g., transistors M3 and M4) to change an edge rate of one of the outputs, thus changing the duty cycle. The range of analog duty cycle correction circuitry 200 may be dependent upon and limited by the transistor sizing of each transistor of each differential pair. The range may also be sensitive to process, voltage, temperature (PVT) and mismatch. As such, the clock rise/fall time is design dependent where a slow rise/fall time may result in a reduced swing and a higher jitter while a fast rise/fall time may result in inadequate duty cycle range. Additionally, the analog duty cycle correction circuitry 200 may be unable to provide a quick start-up capability when compared to other duty cycle correction circuits.

Figure 3:
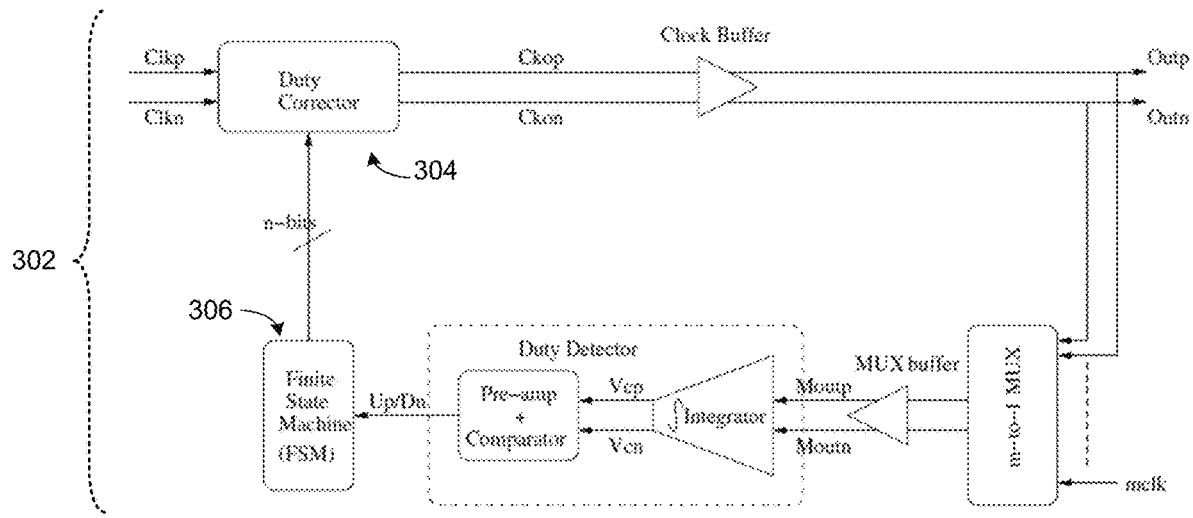
FIG. 3 is a diagram depicting an embodiment of digital duty cycle correction circuitry.
Figure 3:
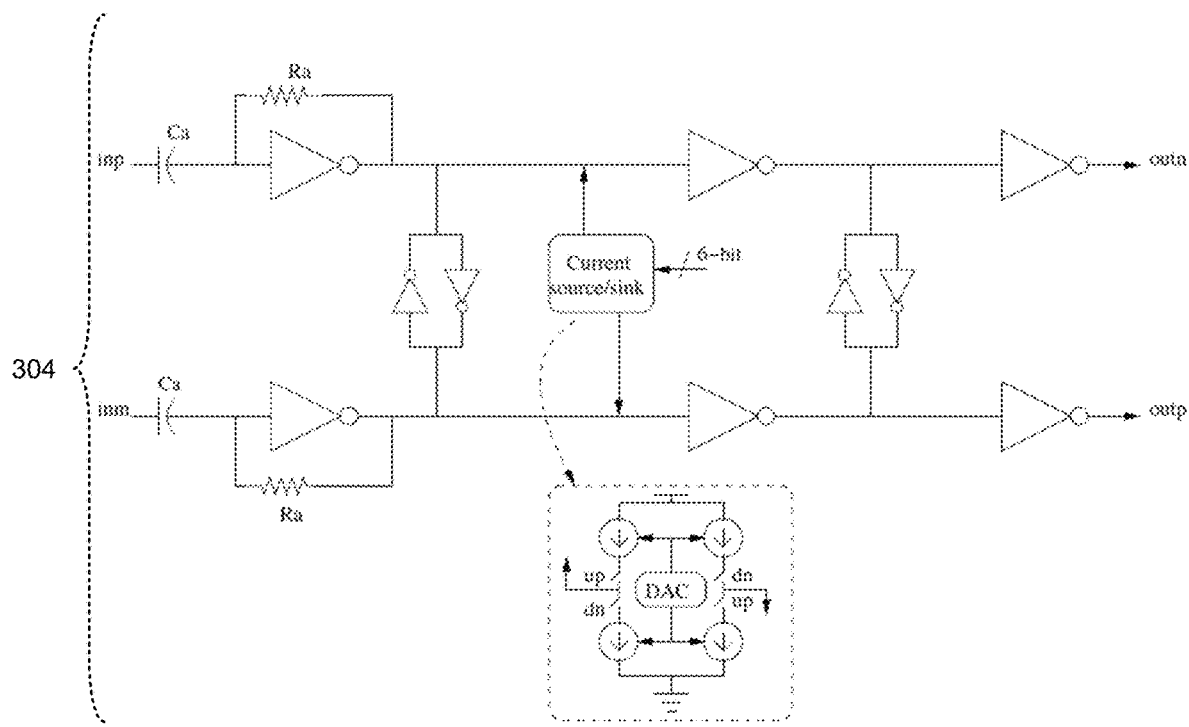

Referring now to FIG. 3, a diagram depicting an example of digital duty cycle correction circuitry 300 is provided. As shown in FIG. 3, digital duty cycle correction circuitry 300 may include a digital loop 302. In this example circuitry, the digital loop 302 may provide negative feedback between a duty cycle corrector circuit 300 based upon a current-mode technique. A finite state machine 306 may control the current digital to analog converter (DAC) to adjust the duty cycle at the output of the digital duty cycle correction circuitry 300. A current DAC designed for the same number of current sources may provide a wide range with large current steps in duty cycle correction or low jitter with fine granularity and low current steps. However, like the analog duty cycle correction circuitry 200 of FIG. 2, digital duty cycle correction circuitry 300 may have range sensitivity based on PVT and mismatch.

Figure 4:
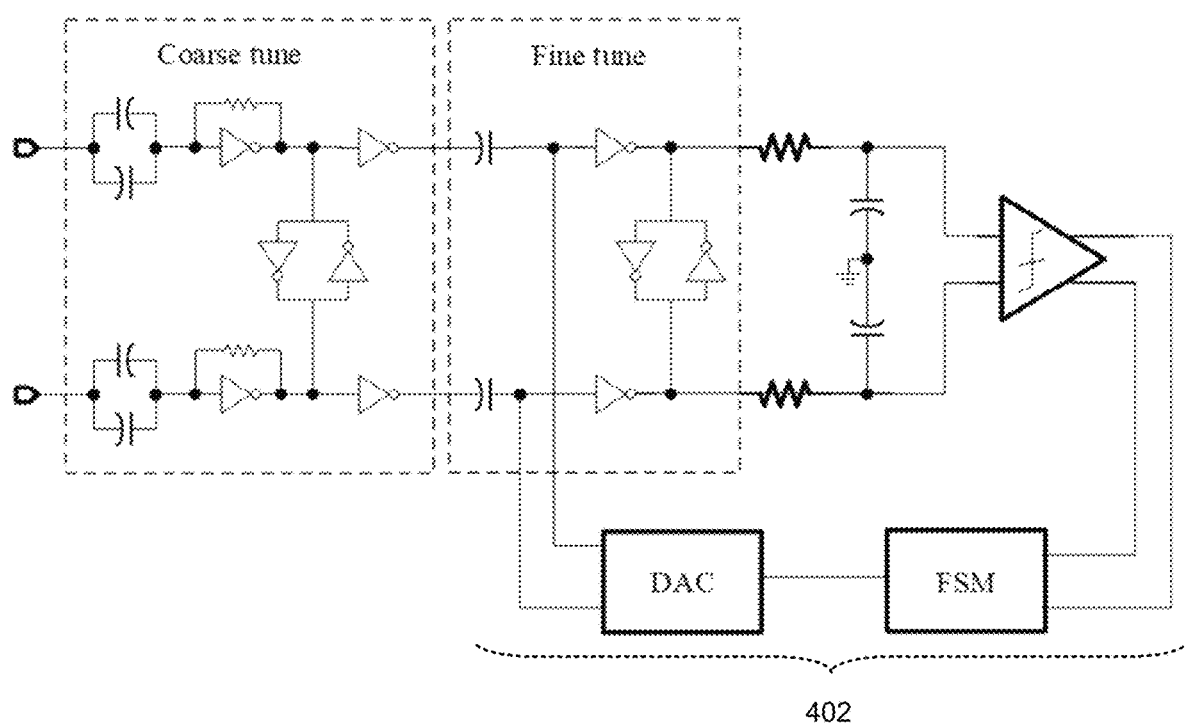
FIG. 4 is a diagram depicting an embodiment of digital duty cycle correction circuitry.

Referring now to FIG. 4, a diagram depicting an example of digital duty cycle correction circuitry 400 is provided. As shown in FIG. 4, digital duty cycle correction circuitry 400 may include a digital loop 402. In this example circuitry, the digital loop 402 may provide negative feedback between a duty cycle corrector circuit 400 based upon a voltage-mode technique. For this digital duty cycle correction circuitry, a correction course may be tuned by level shifting and a feedback resistor to set the DC voltage (e.g., at VDD/2). Additionally, the resistive DAC may adjust the fine tuning for PVT variations, mismatches, etc. However, maximum duty cycle distortion may be determined by edge rates such that a wide range of duty cycle correction may be limited by slow edge rates and a low jitter may be limited by fast edge rates.

Figure 5:
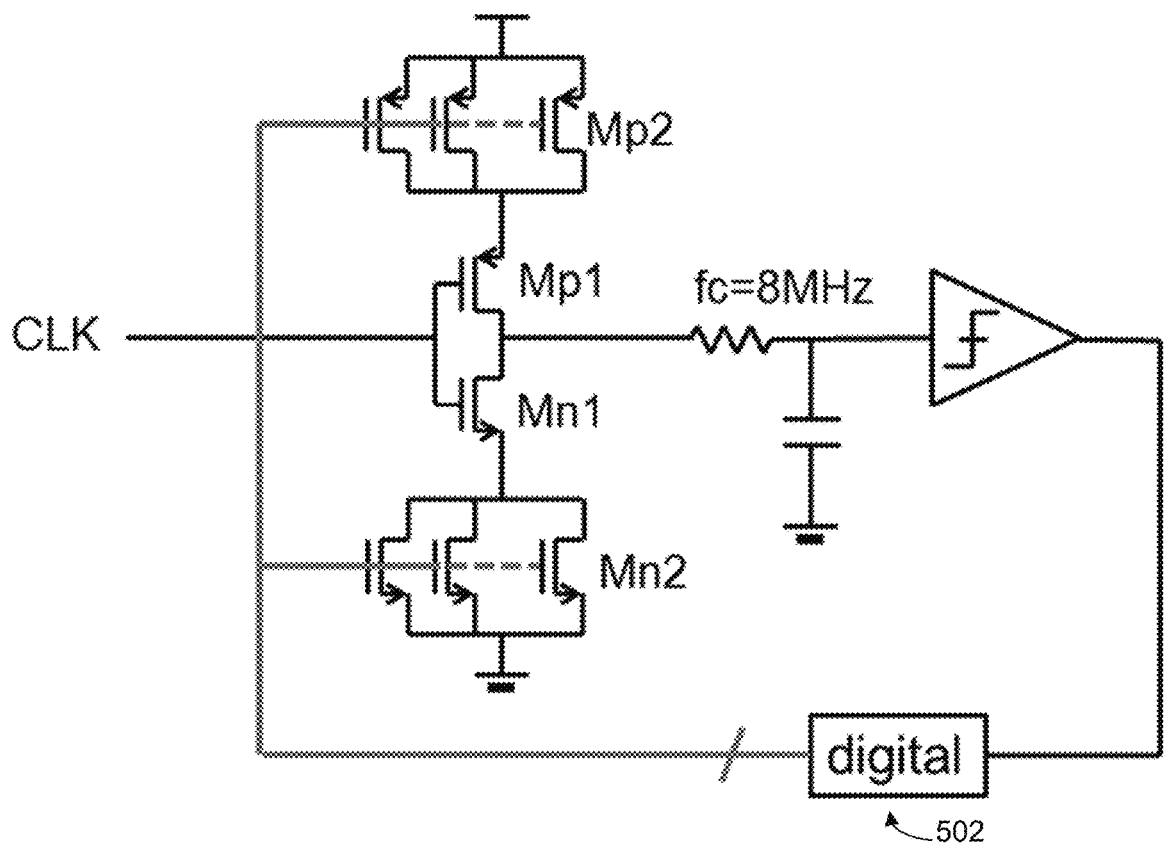
FIG. 5 is a diagram depicting an embodiment of digital duty cycle correction circuitry.

Referring now to FIG. 5, a diagram depicting an example of digital duty cycle correction circuitry 500 is provided. In this example, various transistors (e.g., Mp2 and Mn2) may be configured to control the duty cycle. A digital controller (e.g., digital controller 502) may sweep the output signal until it reaches 50%. The digital duty cycle correction circuitry of FIG. 5 may have the same number of Mp2 transistors as Mn2 transistors which may results in a wide range from larger duty cycle correction steps or low jitter from finer duty cycle correction steps. This digital duty cycle correction circuit may be unable to maintain wide range and fine granularity across PVT.

Figure 6:
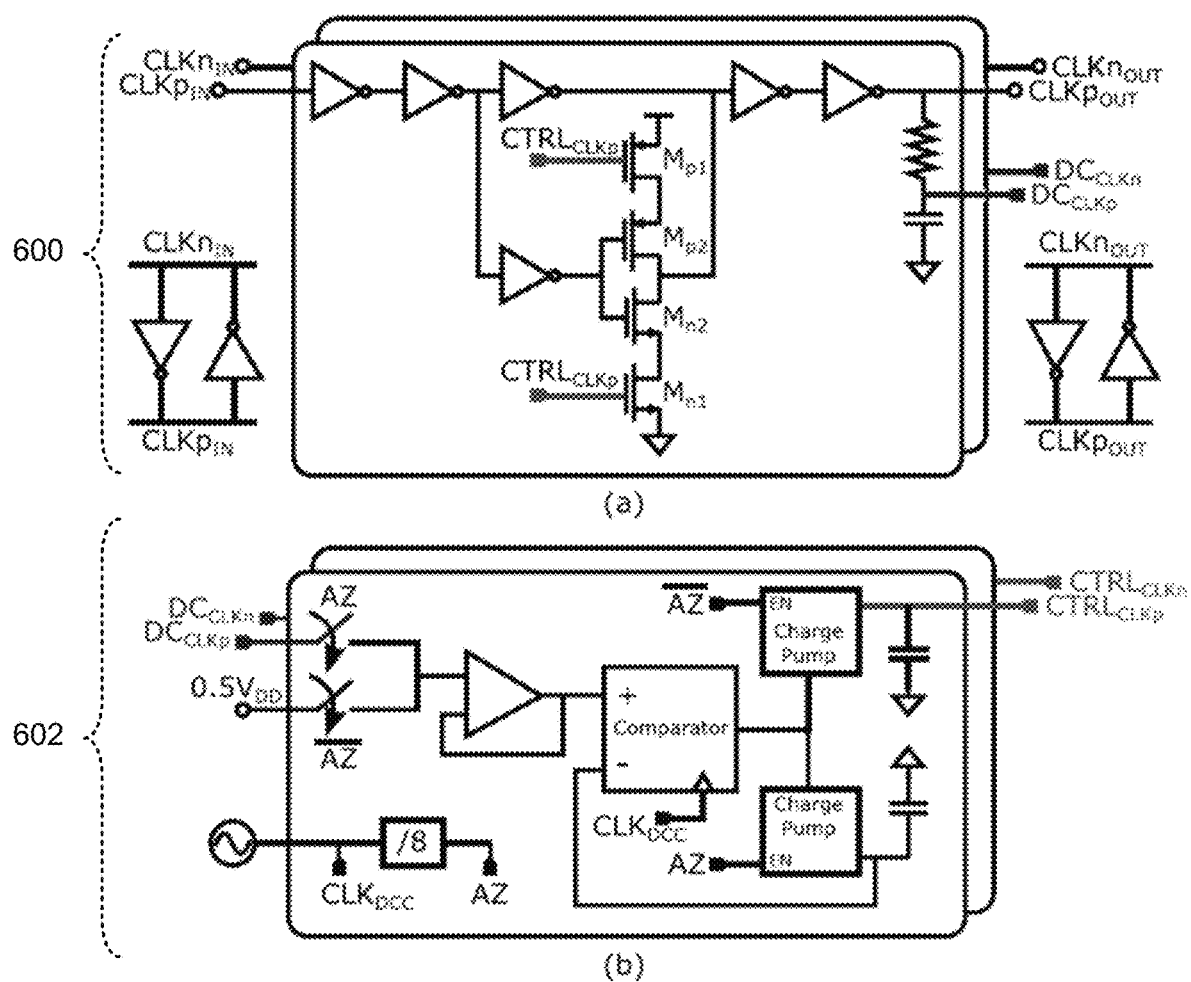
FIG. 6 is a diagram depicting an embodiment of analog duty cycle correction circuitry.

Referring now to FIG. 6, a diagram depicting an example of analog duty cycle correction circuitry 600 is provided. As shown in FIG. 6, analog duty cycle correction circuitry 600 may include an analog loop 602. In this example circuitry, the analog loop 602 may provide negative feedback between a duty cycle corrector circuit 600. In this analog duty cycle correction circuitry, the rising or falling edge of a signal may be delayed by a current-starved inverter that is controlled by a charge pump voltage. As such, the analog duty cycle correction circuitry of FIG. 6 may have high precision (i.e., infinite granularity). However, this circuitry requires large capacitors which need to be pre-charged to 0.5 VDD. As such, this circuitry is not able to provide a quick start-up and may be limited to a single duty cycle correction range.

As discussed above and shown in FIGS. 3-6, conventional duty cycle correction circuitry may be unable to provide solutions to challenges associated with the ability to start-up quickly from a sleep-mode; the ability to correct at least one signal at different locations; the ability to provide sufficient duty cycle correction range for various signal frequencies; and/or the ability to achieve a trade-off between duty cycle correction range and jitter.

Figure 7:
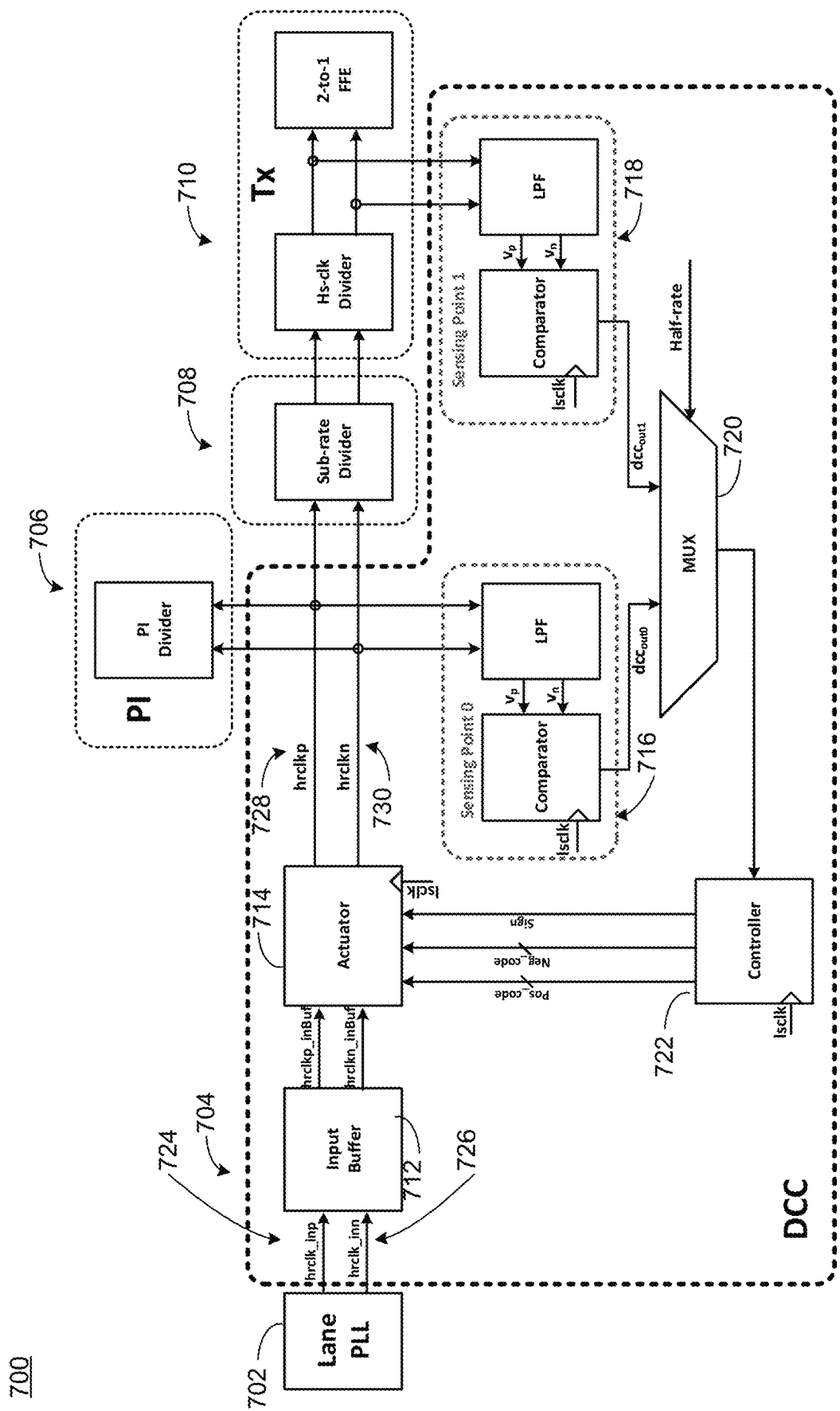
FIG. 7 is a diagram depicting an embodiment of a duty cycle correction circuitry in accordance with the present disclosure.

Referring also to FIG. 7, a duty cycle correction circuitry/module may correct a duty cycle of at least one signal. As will be discussed in greater detail below, duty cycle correction circuitry/module may comprise at least one set of inverters configured to receive the at least one signal and correct the duty cycle of the at least one signal at a correction location of a plurality of correction locations based upon, at least in part, a transmission rate mode of a plurality of transmission rate modes. For example, FIG. 7 shows a lane phase-locked loop (PLL) module 702, a duty cycle correction module 704, a phase interpolator (PI) module 706, a sub-rate divider module 708, and/or a transmitter module 710. In some embodiments, the PLL module may be a signal source and the PI module may be a destination for the output signal of the duty cycle correction module. In some embodiments, the transmitter module may be a destination for the output of the duty cycle correction module 704. In some embodiments, duty cycle correction module 704 may comprise an input buffer 712, an actuator 714, a plurality of correction locations 716, 718, one or more multiplexers 720, and a controller circuit 722. As will be discussed in greater detail below, the at least one set of inverters and the controller circuit may define a digital feedback loop. While additional features and modules have been described to interface with duty cycle correction module 704 (e.g., lane PLL module 702, PI module 706, sub-rate divider module 708, and transmitter module 710), it will be appreciated that various components and modules may be used in conjunction with the duty cycle correction module of the present disclosure.

In some embodiments, the lane PLL module 702 may generate a single-ended clock that may be converted to complementary clocks (e.g., a clock for each polarity) by the duty cycle correction module (e.g., duty cycle correction module 704). In the example of FIG. 7, the complementary clocks may be represented as hrclk_inp 724 and hrclk_inn 726. The complimentary clocks may be processed by an input buffer 712. In some embodiments, the rise and fall times of a differential half-rate clock (e.g., hrclkp 728 and hrclkn 730) may be controlled by an actuator (e.g., actuator 714). While a half-rate differential clock has been described, it will be appreciated that any transmission rate and/or input signal may have its duty cycle corrected.

Figure 8:
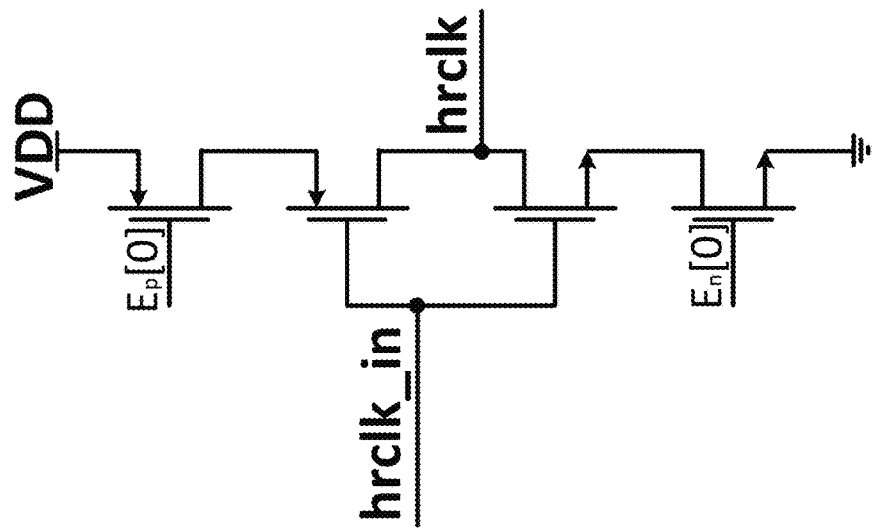
FIG. 8 is a diagram depicting an embodiment of a three-state inverter in accordance with the present disclosure.

Referring also to FIGS. 8-11, the actuator (e.g., actuator 714) may comprise at least one set of inverters. For example and referring to FIG. 8, the set of inverters may include a set of reconfigurable, digitally-controlled three-state inverters (e.g., inverter 800) connected in parallel. As shown in FIG. 8, the three-states or three states may include a first state with all transistors on; a second state with the PMOS transistor off and the NMOS transistor on; and a third state with the PMOS transistor on and the NMOS transistor off. As will be discussed in greater detail below, each state of the transistor may provide a unique step or change in the duty cycle of an input signal or clock.

Figure 9:
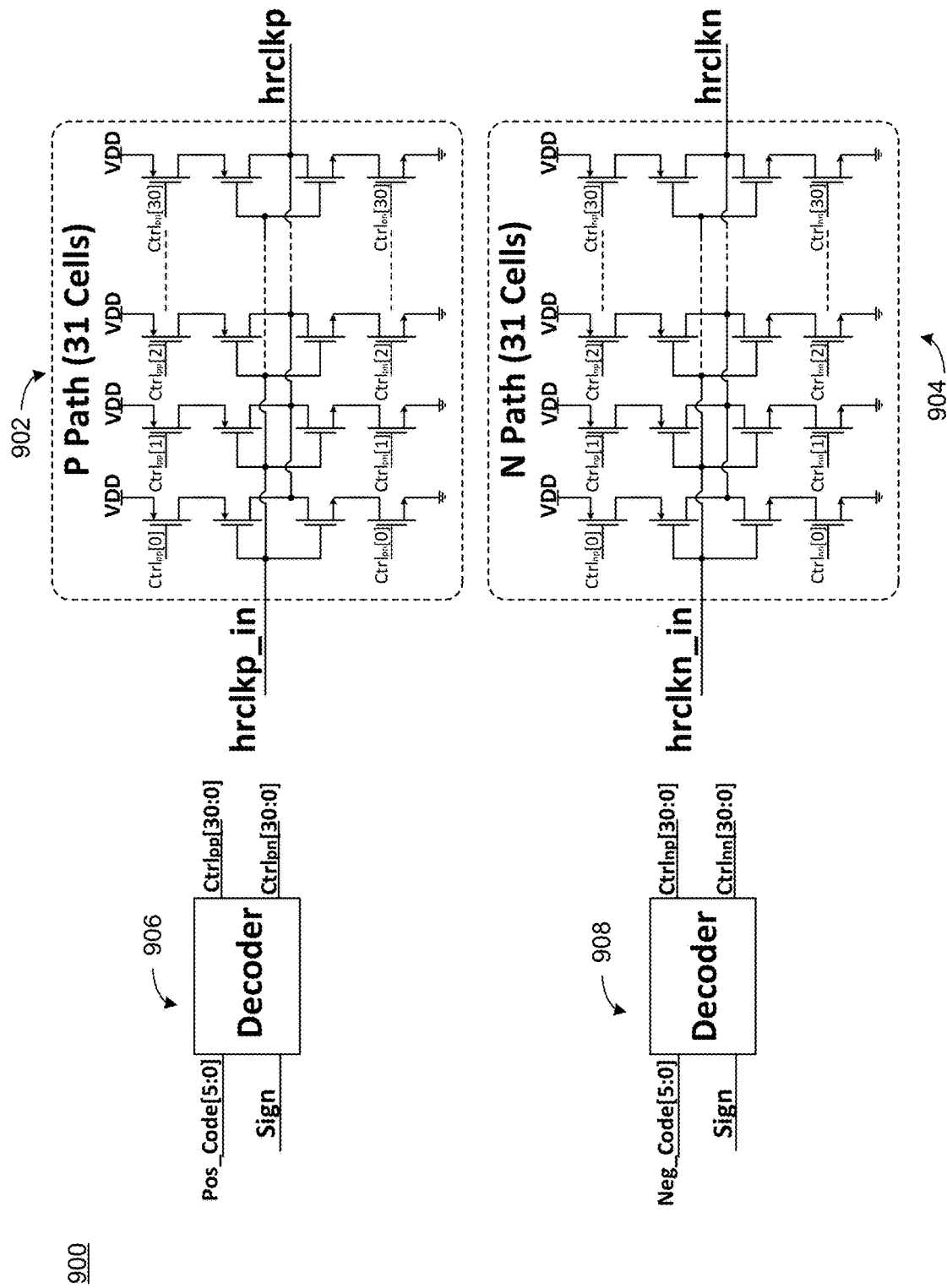
FIG. 9 is a diagram depicting an embodiment of at least one set of inverters in accordance with the present disclosure.

Referring also to FIG. 9, an actuator may include a separate set of inverters (e.g., set of inverters 902, 904) for each differential clock. The actuator may provide enhanced granularity in duty cycle correction step sizes. In this example, each set of inverters for each signal path may include e.g., 31 inverter cells corresponding to e.g., 31 control signals. The inverter cells may include e.g., 31 three-state inverters of FIG. 8 arranged in parallel with complex routing for each differential clock. However, in some embodiments, the usage of e.g., 31 separate units of inverters may result in a very large capacitive load over a large surface area.

Figure 10:
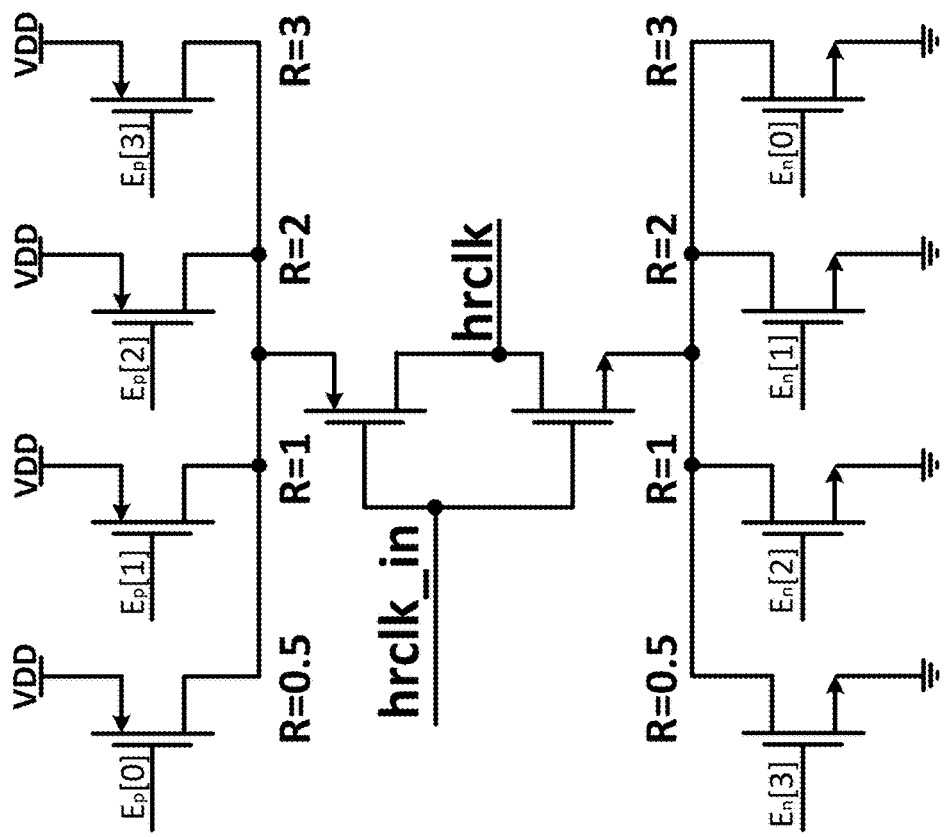
FIG. 10 is a diagram depicting an embodiment of a nine-state inverter cell in accordance with the present disclosure.
Figure 11:
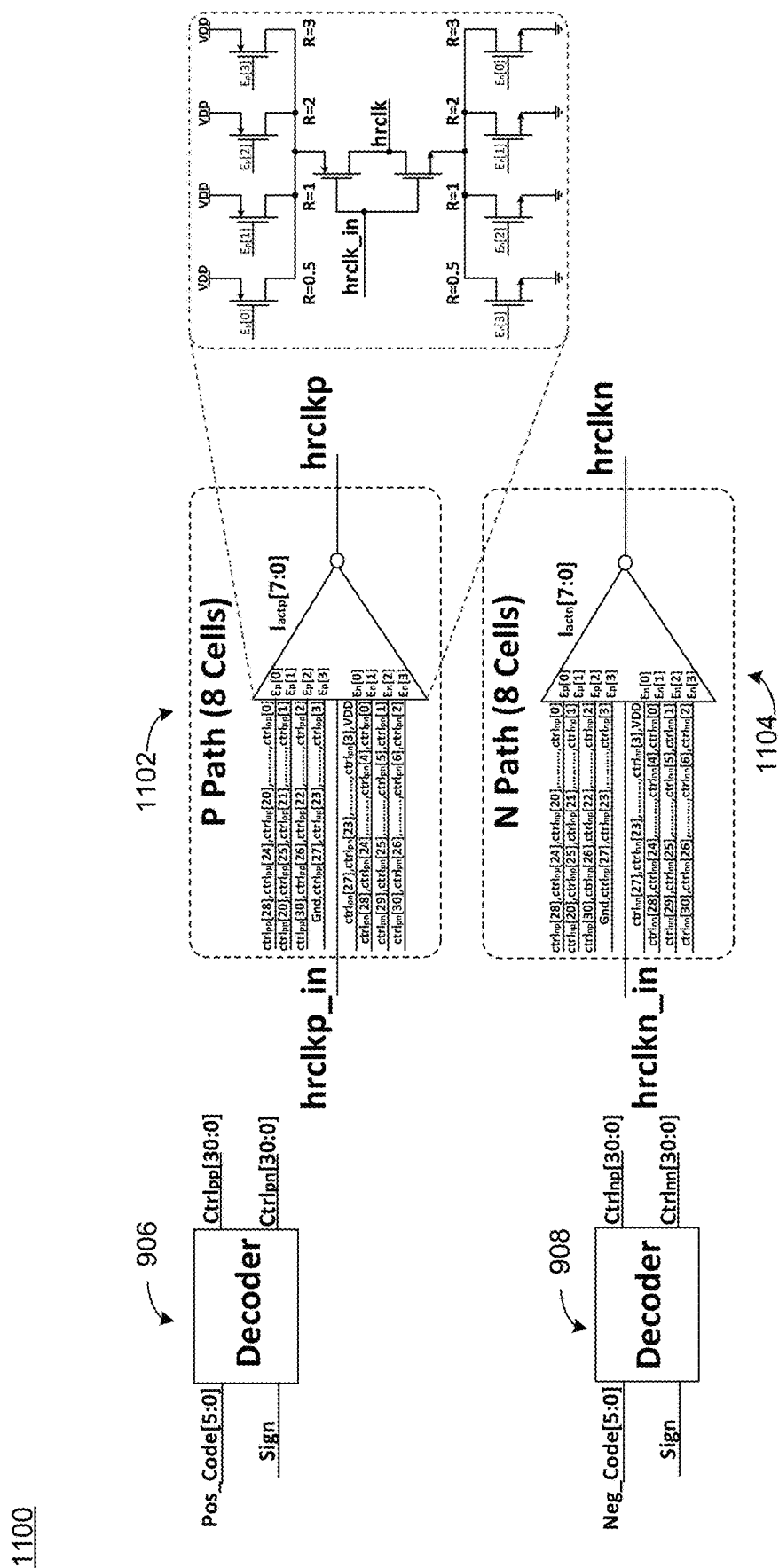
FIG. 11 is a diagram depicting an embodiment of at least one set of inverters in accordance with the present disclosure.

Referring also to FIG. 10, an actuator may include at least one nine-state inverter cell (e.g., nine-state inverter cell 1000) comprising a plurality of NMOS and PMOS transistors. As shown in FIG. 10, the nine-state inverter may include a plurality of NMOS and PMOS transistors with different sizing to generate quasi-linear steps sizes. For example, the pull-up and pull-down strength of the at least one nine-state inverter cell may control the rise and fall times of a clock which may control the duty cycle. When compared to the actuator of FIG. 9, the nine-state inverter of FIG. 11 may use a single nine-state inverter cell instead of four three-state inverters, thus resulting in a lower capacitive load (e.g., reduced by ¾). As shown in FIG. 10, the nine states of the at least one nine-state inverter may include a first state with all transistors on; a second state with one PMOS transistor off and all other transistors on; a third state with two PMOS transistors off and all other transistors on; a fourth state with three PMOS transistors off and all other transistors on; a fifth state with four PMOS transistors off and all other transistors on; a sixth state with one NMOS transistor off and all other transistors on; a seventh state with two NMOS transistors off and all other transistors on; an eighth state with three NMOS transistors off and all other transistors on; and a ninth state with four NMOS transistors off and all other transistors on.

Figure 12:
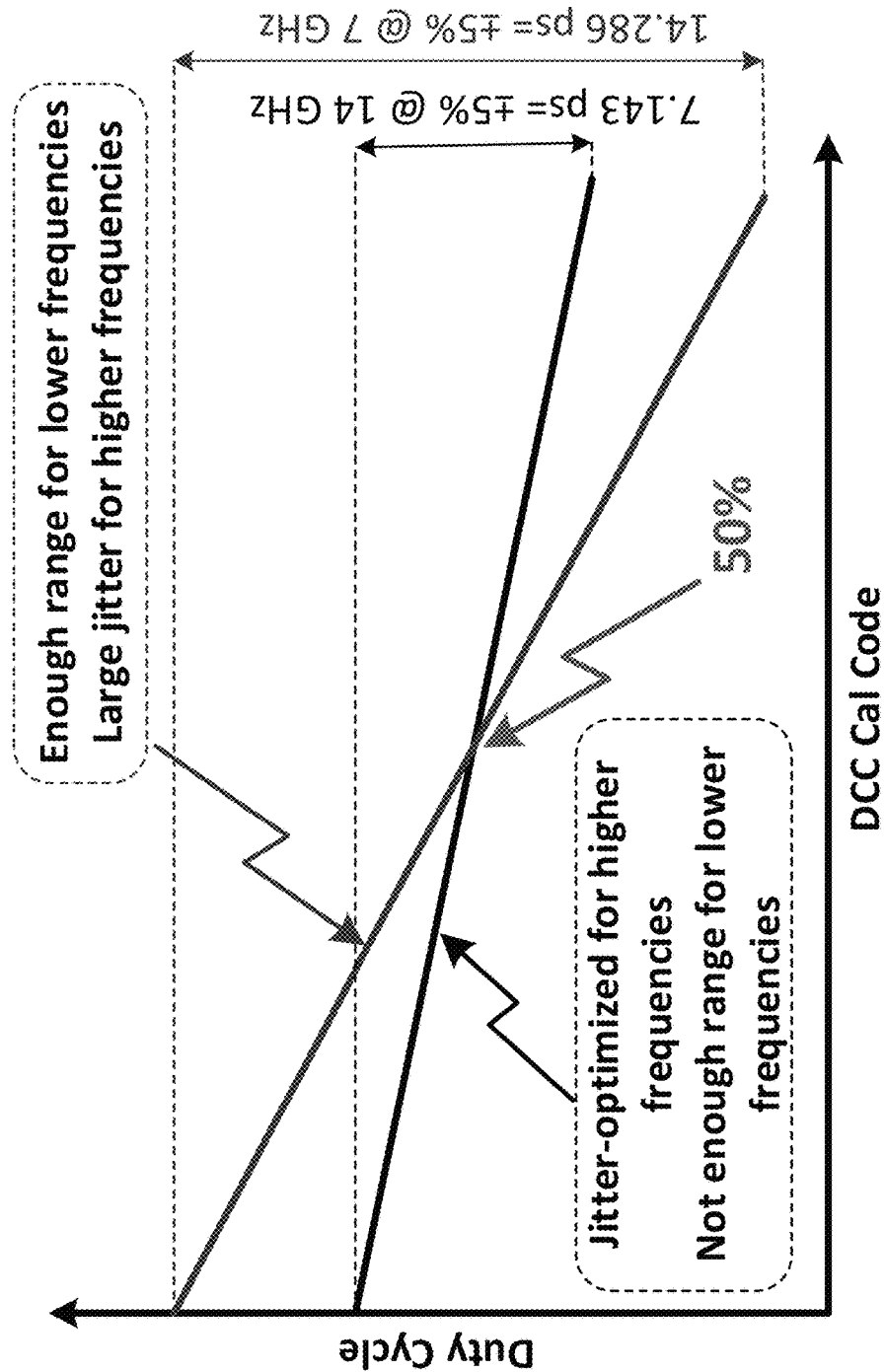
FIG. 12 is a diagram depicting a jitter-range tradeoff across clock frequencies in accordance with the present disclosure.
Figure 13:
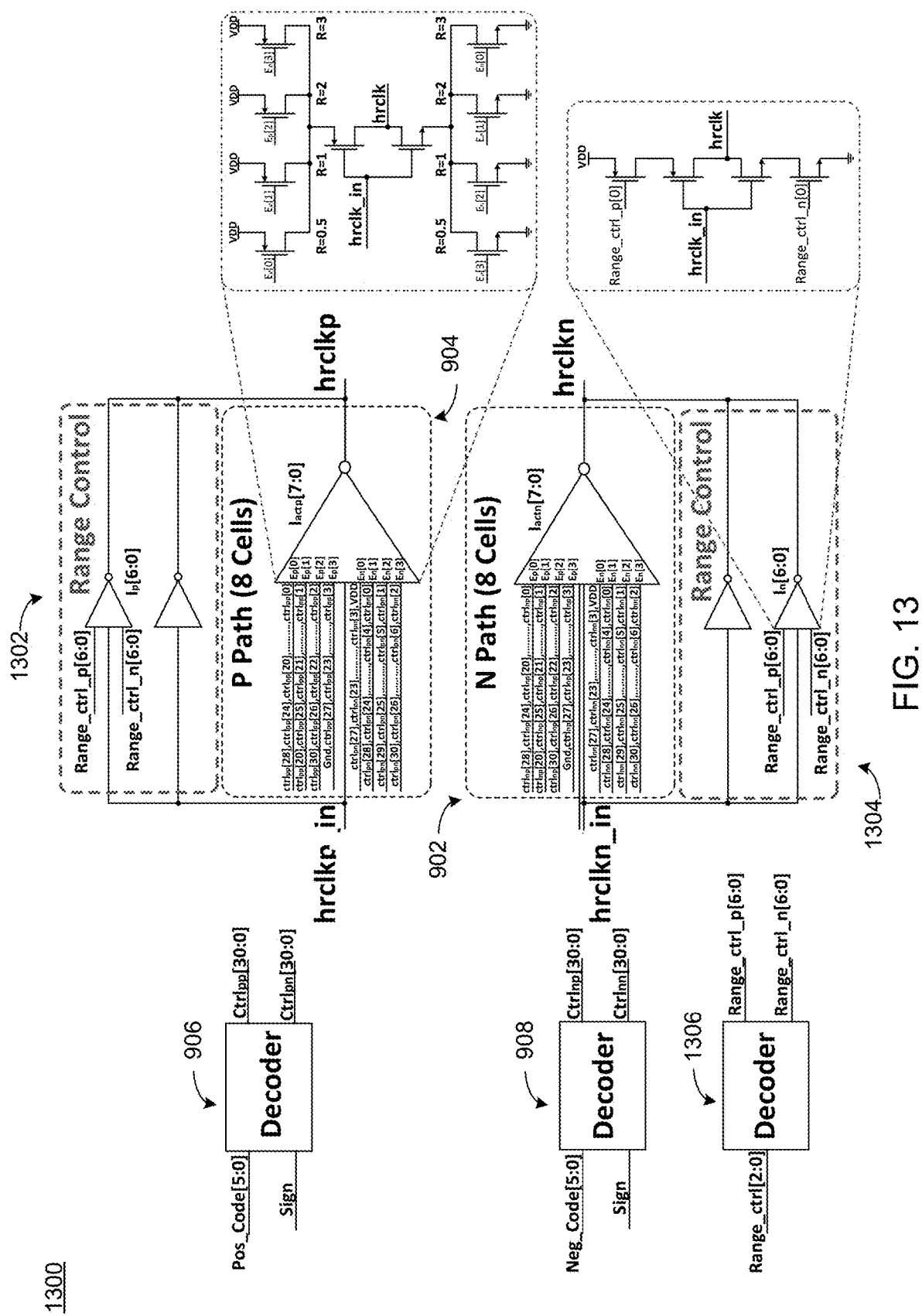
FIG. 13 is a diagram depicting an embodiment of at least one set of inverters in accordance with the present disclosure.

Referring also to FIGS. 12-13, a plurality of inverters in parallel with the at least one set of inverters, wherein the plurality of inverters are configured to provide a configurable duty cycle correction range. Duty cycle correction circuitry may provide a duty cycle correction range (e.g., ±5% duty cycle) for a given clock. However, the duty cycle correction range may be limited for a particular frequency based upon a jitter-range tradeoff. For example and as shown in FIG. 12, the duty cycle correction range for a given clock may be sufficient for lower frequencies because of larger steps but may cause larger jitter for higher frequencies. Alternatively, a duty cycle correction range for a given clock may provide low jitter sufficient for higher frequencies because of finer duty cycle correction steps but may be limited in range because of the finer granularity of duty cycle correction steps. In other words, to support a correction range of 45%-55% for low frequency such as 7 GHz, a range of 14.286 picoseconds may be required whereas 45%-55% for 14 GHz may be 7.143 picoseconds, which is half of the 7 GHz range. If a single range is used for serving both frequencies, it may result in large correction steps to cover the 14.286 picoseconds. As a result, the large correction step may create jitter for the high frequencies. If the range is optimized for the higher frequencies to avoid added jitter, it may result in finer correction steps that cannot cover the range required by the lower frequencies. As will be discussed in greater detail below, embodiments of the present disclosure may allow for a configurable/reconfigurable duty cycle correction range.

In some embodiments and referring also to FIG. 13, a plurality of inverters may be positioned in parallel with the at least one set of inverters and may be configured to provide a configurable duty cycle correction range. For example, a plurality of digitally-controlled three-state inverters may be connected in parallel to the at least one set of inverters of the actuator. By controlling the drive strength of each of the duty cycle correction range inverters, the rise and/or fall times of the clock may be modified. For example, with a high driving strength, the combination of the at least one set of inverters (e.g., set of inverters, 902, 904) and the plurality of inverters in parallel (e.g., inverters 1302, 1304) with the at least one set of inverters may provide a finer duty cycle correction steps, lower jitter, and lower range. In this manner, by enabling at least a portion of the plurality of range inverters, the duty cycle correction range may be decreased. Alternatively, disabling at least a portion of the plurality of inverters may increase the duty cycle correction range. In the example of FIG. 13, eight inverters may be added in parallel to provide eight different ranges. In some embodiments, the enabling or disabling of various range inverters may be controlled by a range signal provided by the controller circuit (e.g., controller circuit 722) and decoded by decoder 1306 into individual control signals for each inverter.

Figure 14:
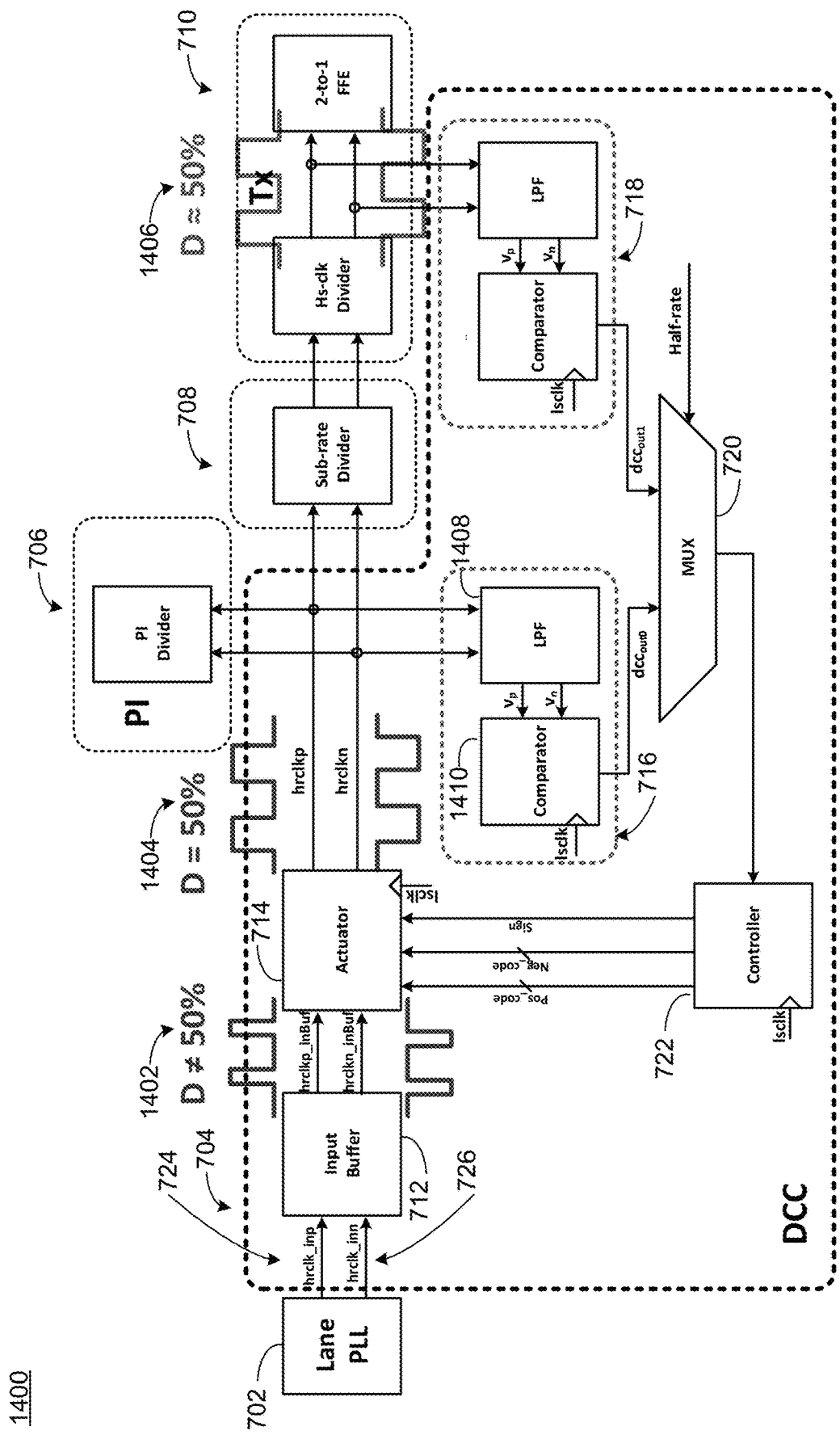
FIG. 14 is a diagram depicting an embodiment of a plurality of correction locations in accordance with the present disclosure.
Figure 15:
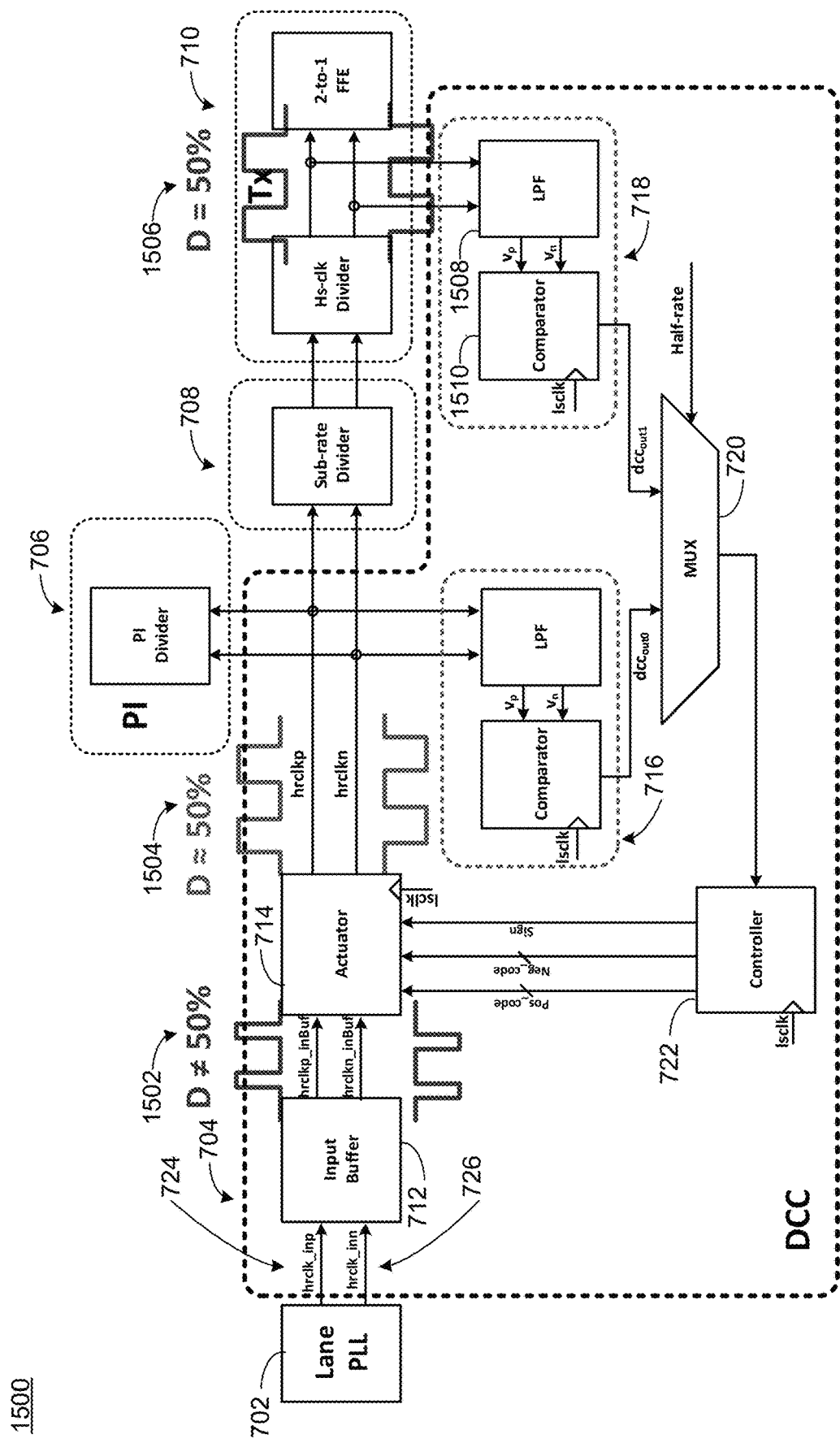
FIG. 15 is a diagram depicting an embodiment of a plurality of correction locations in accordance with the present disclosure.

As discussed above, the at least one set of inverters may be configured to receive the at least one signal and correct the duty cycle of the at least one signal at a correction location of a plurality of correction locations based upon, at least in part, a transmission rate mode of a plurality of transmission rate modes. Referring also to FIGS. 14 and 15, the duty cycle correction circuitry may include multiple sensing points or correction locations (e.g., correction locations 716, 718) where the duty cycle of the at least one signal may be corrected.

For example, FIG. 14 shows the input signals received at the actuator (e.g., signals 1402) with a duty cycle not equal to e.g., 50%. In some embodiments, the at least one set of inverters (e.g., actuator 714) may be configured to correct the at least one output signal (e.g., signals 1404) at a first correction location during a first transmission rate mode. In the example of FIG. 14 and in some embodiments, the first correction location (e.g., correction location 716) may be at an output of the at least one set of inverters and the first transmission rate mode may be a non-half-rate transmission mode. In some embodiments, the duty cycle correction circuitry may include a sub-rate divider (e.g., sub-rate divider module 708) configured to divide the high-speed differential clocks by e.g., two to enable lower rate operation of the transmitter. For example, the division by e.g., two inherently creates a clock with low duty-cycle and thus removes the correlation between the duty cycle distortion (DCD) at the output of the at least one set of inverters and the DCD at the output of the sub-rate divider. The DCD can then be fixed at a point located before the divider. The PI module 706 may receive the high-speed differential clocks at the output of the actuator. In some embodiments, the duty cycle correction circuitry may include a filter (e.g., low pass filter (LPF) 1408) and a comparator (e.g., comparator 1410) configured to sample the duty cycle of the at least one signal (e.g., signal 1404) at the first correction location (i.e., at the output of the actuator/set of inverters). In some embodiments, the filter (e.g., filter 1408) may be an analog LPF of order n with a digital accumulator to define an (n+1)-order detection scheme with a low-bandwidth digital control loop that may minimize the output residual duty cycle correction error (i.e., jitter) and may provide a high calibration accuracy.

In some embodiments, any duty cycle distortion may be detected by comparing the average value of the differential clocks that is generated by passing the differential clocks through the low-pass filter (LPF). The comparison may be achieved by an offset-cancellation (auto-zero) comparator (e.g., comparator 1410), thus generating a feedback signal. In some embodiments, the comparison of the clocks average value may be continuous to detect if the differential duty cycle is lower or higher than 50%. As will be discussed in greater detail below, a controller circuit may receive the comparator output to determine whether to increase or decrease the duty cycle of the at least one signal to correct the duty to cycle to a pre-defined duty cycle (e.g., 50%). While a duty cycle of 50% has been discussed, it will be appreciated that other duty cycles are possible (e.g., 10%, 20%, 30%, 40%, 60%, 70%, 80%, 90%, and/or duty cycles in between).

In some embodiments, the at least one set of inverters (e.g., actuator 714) may be configured to correct the at least one output signal (e.g., signals 1502) at a second correction location during a second transmission rate mode. In the example of FIG. 15 and in some embodiments, the second correction location (e.g., correction location 718) may be at an input of a transmitter circuit electrically coupled to the at least one set of inverters and the second transmission rate mode is a half-rate transmission mode. For example, during half-rate transmission modes, the transmitter may be sensitive for the duty cycle residual errors. Accordingly, the duty cycle may be corrected at the input of the 2-to-1 serializer (e.g., transmitter 710). In some embodiments, the duty cycle correction circuitry may include a filter (e.g., low pass filter (LPF) 1508) and a comparator (e.g., comparator 1510) configured to sample the duty cycle of the at least one signal (e.g., signal 1506) at the second correction location (i.e., at the input of the transmitter 710). As discussed above and in some embodiments, the filter (e.g., filter 1508) may be an analog LPF of order n with a digital accumulator to define an (n+1)-order detection scheme with a low-bandwidth digital control loop that may minimize the output residual duty cycle correction error (i.e., jitter) and may provide a high calibration accuracy.

In some embodiments and as discussed above, any duty cycle distortion may be detected by comparing the average value of the differential clocks that is generated by passing the differential clocks through the low-pass filter (LPF). The comparison may be achieved by an offset-cancellation (auto-zero) comparator (e.g., comparator 1510), thus generating a feedback signal. As will be discussed in greater detail below, a controller circuit may receive the comparator (e.g., comparator 1510) output to determine whether to increase or decrease the duty cycle of the at least one signal. While two example correction locations have been discussed for two example transmission rate modes, it will be appreciated that the duty cycle of the at least one signal may be corrected at various locations within the duty cycle correction circuitry for various transmission rate modes.

In some embodiments, the duty cycle correction circuitry may include a controller circuit configured to provide one or more control signals to the at least one set of inverters to correct the duty cycle of the at least one signal at the correction location based upon, at least in part, the transmission rate mode. Referring again to FIG. 7, a controller circuit (e.g., controller circuit 722) may receive the output of a multiplexer (e.g., MUX 720) that multiplexes which comparator output (e.g., comparator 1410 or comparator 1510) the controller circuit receives based upon, at least in part, the transmission rate mode (e.g., half-rate transmission mode or non-half-rate transmission mode). For example, if the transmission rate mode is a half-rate transmission mode, the controller circuit may receive the output of comparator 1410 and if the transmission rate mode is a non-half-rate transmission mode, the controller circuit may receive the output of comparator 1410. While outputs of two comparators have been discussed, it will be appreciated that any number of comparators corresponding any number of correction locations may be used within the scope of the present disclosure.

Figure 16:
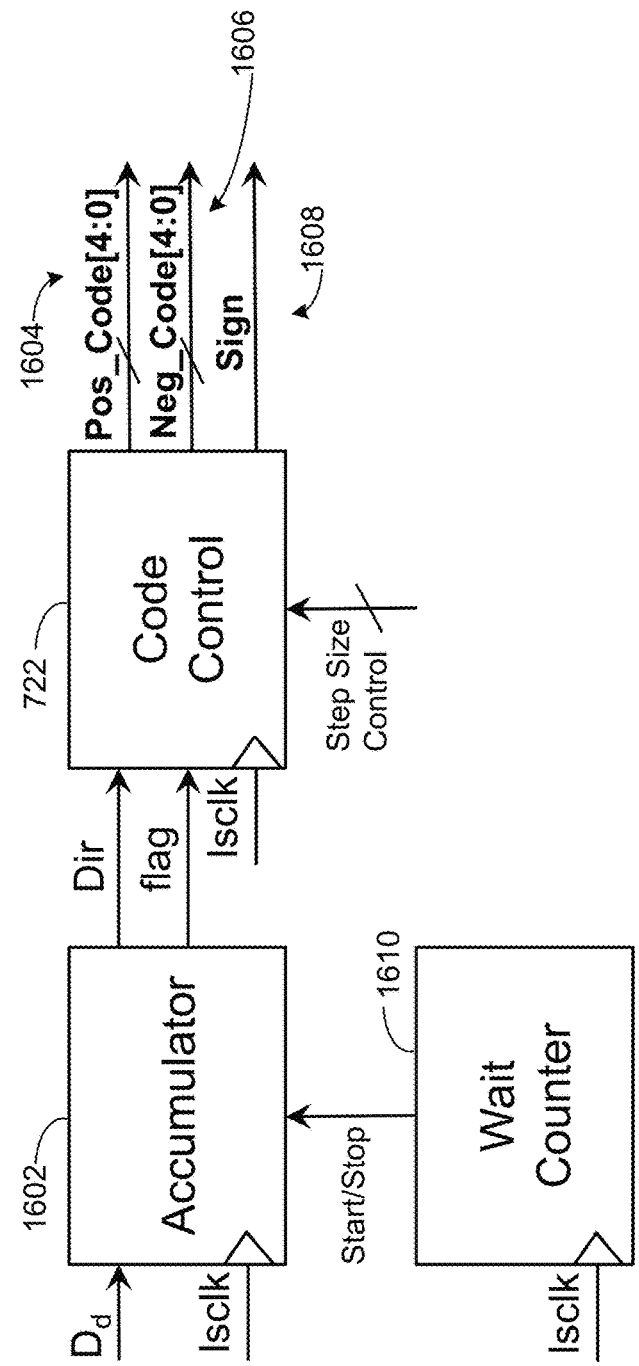
FIG. 16 is a diagram depicting an embodiment of a controller circuit in accordance with the present disclosure.

Referring also to FIG. 16, the digital controller may sample the comparator output, filters it with an accumulator (e.g., accumulator 1602), and then may make the decision to increase or decrease one or more digital control codes (e.g., Pos_Code[4:0] 1604, Neg_Code[4:0] 1606, and/or Sign 1608). In some embodiments and as shown in FIG. 16, the comparator output may be synchronous with the e.g., lsclock. The accumulator may have a programmable depth and may have an accumulation time controlled by a programmable wait timer (e.g., Wait Counter 1610). In some embodiments, the digital controller may sample the accumulator when the flag is high and may tune the clock duty cycle to 50% through its calibration codes (e.g., Pos_Code [4:0] 1604, Neg_Code[4:0] 1606, and/or Sign 1608). While Pos_Code 1604 and Neg_Code are described as five-bit values, it will be appreciated that any number of bits may be used to define the control codes for the controller circuit.

In some embodiments, the calibration logic may utilize an e.g., seven-bit binary encoded code to change the values of the duty cycle. For example, the duty cycle may decrease with an increase in the calibration code value and vice-a-versa. In some embodiments, the calibration codes may include a "coarse" granularity and a "fine" granularity. The coarse granularity may begin at zero and may be adjusted with a step size greater than or equal to one step. For example, the step size may be programmable and/or user-defined. The fine granularity may adjust each code by one where one code (e.g., one of Pos_Code, Neg_Code, and/or Sign) is updated at a time. In some embodiments of the fine granularity adjustments, the calibration codes may not differ by more than one. In some embodiments, if the duty cycle as determined by the comparator is greater than e.g., 50%, the signal "Dir" may be set to "1" and if the duty cycle is less than e.g., 50%, the signal "Dir" may be set to "0". In some embodiments, the controller circuit may be placed in a hold state where it may keep the value of the control signals constant, enabling the duty cycle correction module to restart with a good correction code even if the circuit is disabled for a period of time (e.g., after a sleep or low power mode).

As discussed above, and in some embodiments, the controller circuit (e.g., controller circuit 722) may be a digital control circuit and may (in combination with actuator 714) define a negative feedback loop to correct the duty cycle of the at least one signal. As discussed above relative to analog duty cycle correction circuits, duty cycle correction module 704 may keep the duty-cycle correction code without decay and thus may be able to start up more quickly than analog feedback loops after a sleep or low power mode. In this manner, the duty cycle correction module may restart quickly with a good correction code.

Figure 17:
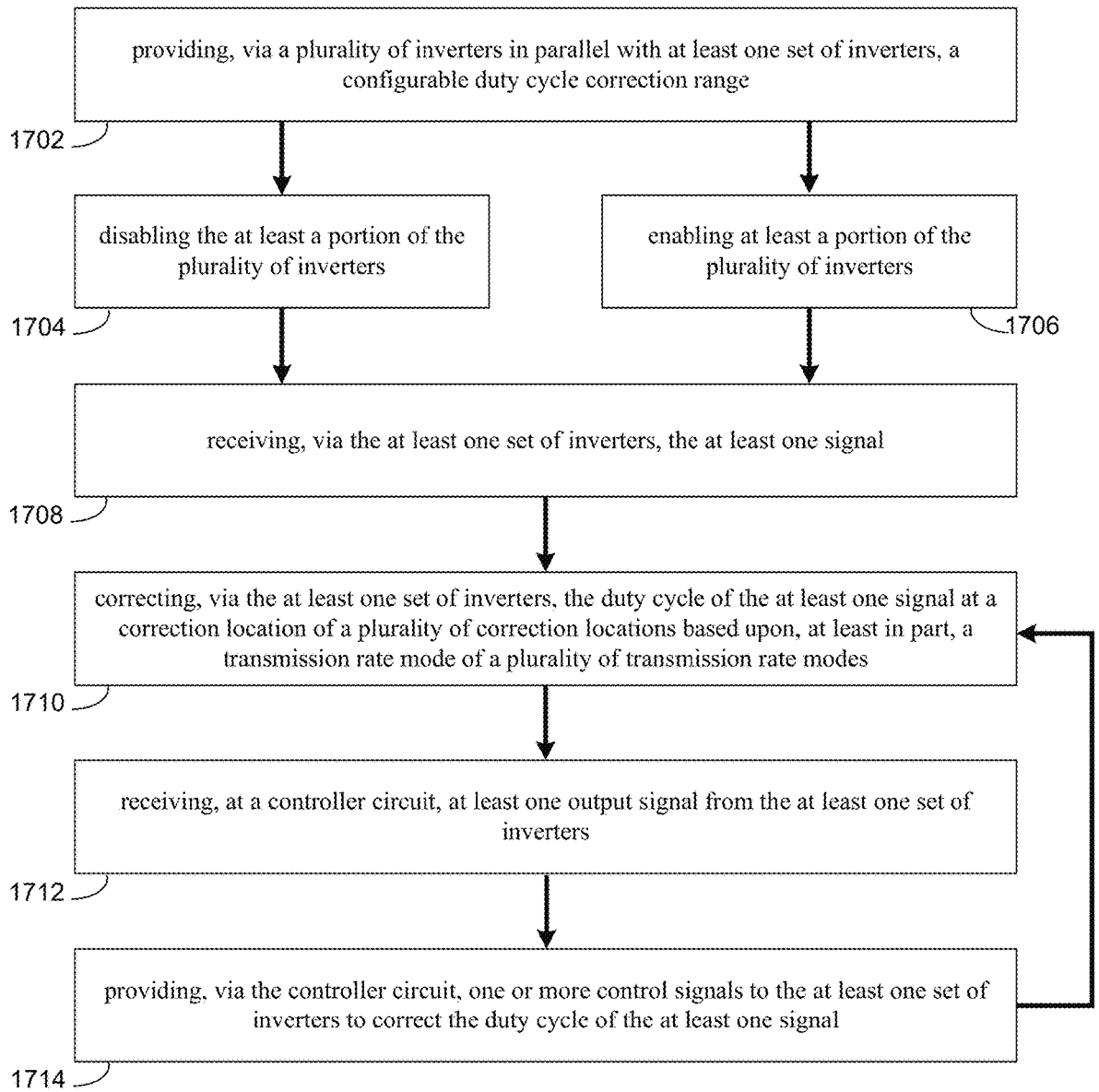
FIG. 17 is a flowchart depicting operations consistent with an embodiment of the duty cycle correction process in accordance with the present disclosure.

Referring now to FIG. 17, a flowchart 1700 depicting exemplary operations for correcting a duty cycle of at least one signal associated with the duty cycle correction process of the present disclosure is provided. The process may further include providing (1702), via a plurality of inverters in parallel with at least one set of inverters, a configurable duty cycle correction range. The process may also include one or more of disabling (1704) the at least a portion of the plurality of inverters and enabling (1706) at least a portion of the plurality of inverters. The process may include receiving (1708), via the at least one set of inverters, the at least one signal. The process may further include correcting (1710), via the at least one set of inverters, the duty cycle of the at least one signal at a correction location of a plurality of correction locations based upon, at least in part, a transmission rate mode of a plurality of transmission rate modes. The process may also include receiving (1712) at a controller circuit, at least one output signal from the at least one set of inverters and providing (1714), via the controller circuit, one or more control signals to the at least one set of inverters to correct the duty cycle of the at least one signal. As discussed above, this process may repeat to maintain the duty cycle.

Figure 18:
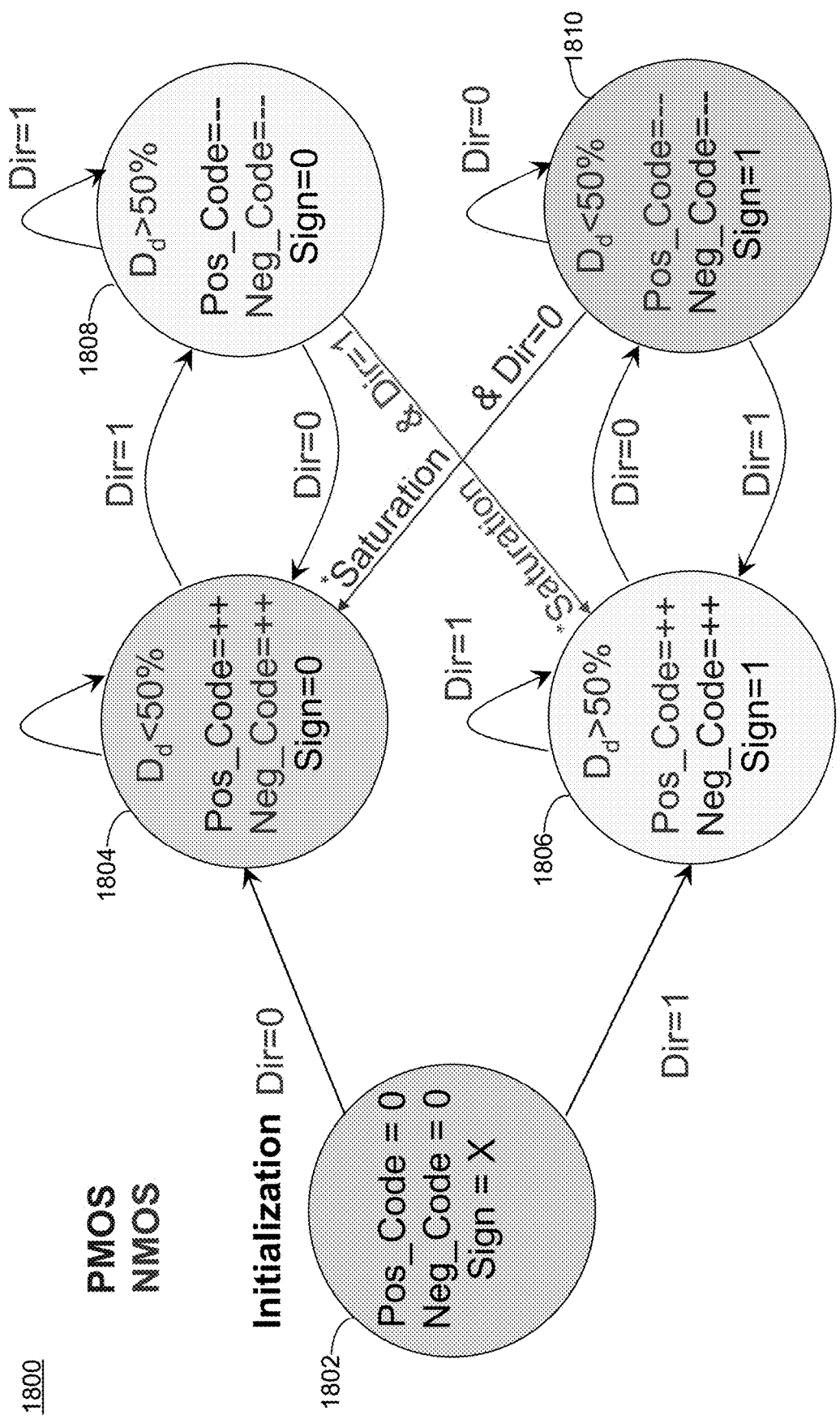
FIG. 18 is a state diagram depicting an embodiment of initialization of the at least one set of inverters in accordance with the present disclosure.

Referring to the example state diagram of FIG. 18, the at least one set of inverters may receive at least one signal. The duty cycle of the at least one signal may be transmitted, via a transmitter, at a pre-defined transmission rate or transmission rate mode. Based upon, at least in part, the transmission rate mode, the controller circuit may receive a signal indicating whether the duty cycle of the at least one signal is greater than or less than a target duty cycle (e.g., 50%). In this example, the controller circuit may be initialized in the state 1802 with "Pos_Code" and "Neg_Code" equal to zero. If the "Dir" signal is "0" (i.e., the duty cycle is less than 50%), the controller circuit may advance to state 1804 where the controller circuit may increment "Pos_Code" value for PMOS transistors of the set of inverters; increment the "Neg_Code" value for NMOS transistors; and set the "Sign" signal value to "0". If the "Dir" signal is "1" (i.e., the duty cycle is greater than 50%), the controller circuit may advance to state 1806 where the controller circuit may increment "Pos_Code" value for NMOS transistors of the set of inverters; increment the "Neg_Code" value for PMOS transistors; and set the "Sign" signal value to "1".

During the state 1804, if the "Dir" changes to "1" (i.e., the duty cycle is greater than 50%), the controller circuit may advance to state 1808 and decrement the "Pos_Code" value for PMOS transistors of the set of inverters and decrement the "Neg_Code" value for NMOS transistors. While in state 1804, if "Dir" remains at "0", the controller circuit may iteratively increment "Pos_Code" value for PMOS transistors of the set of inverters and increment the "Neg_Code" value for NMOS transistors.

While in state 1808, if "Dir" changes to "0", the controller circuit may return to state 1804. However, while in state 1808, if Pos_Code and Neg_Code are decremented to zero and "Dir" remains "1", the set of inverters may be characterized as saturated and the controller circuit may advance to state 1806. In state 1806, the controller circuit may increment "Pos_Code" value for NMOS transistors of the set of inverters; increment the "Neg_Code" value for PMOS transistors, and change the "Sign" signal from "0" to "1". While in state 1806, if "Dir" changes to "0", the controller circuit may advance to state 1810 and may decrement the "Pos_Code" value for PMOS transistors of the set of inverters and decrement the "Neg_Code" value for NMOS transistors while "Dir" is "0". While in state 1810, if "Dir" changes to "1", the controller circuit may return to state 1808. In some embodiments and while in state 1810, if the Pos_Code value for the NMOS transistors and the Neg_Code for the PMOS transistors saturates (e.g., Pos_Code and Neg_Code equal zero), the controller circuit may advance to state 1804 where the "Pos_Code" value for PMOS transistors of the set of inverters may be incremented; the "Neg_Code" value for NMOS transistors may be incremented; and the "Sign" signal may be changed from "1" to "0".

Figure 19:
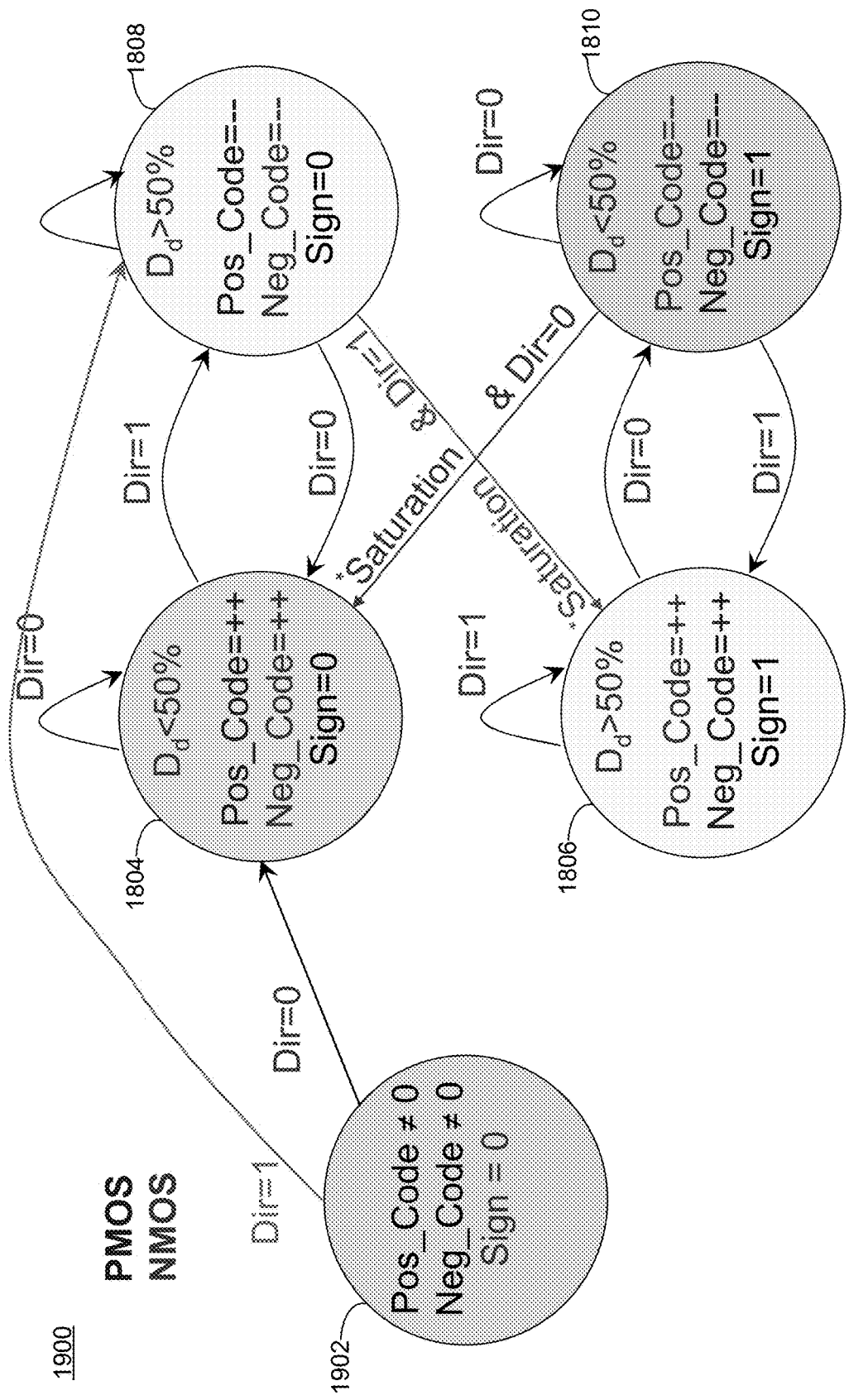
FIG. 19 is a state diagram depicting an embodiment of a maintenance mode of the at least one set of inverters in accordance with the present disclosure.
Figure 20:
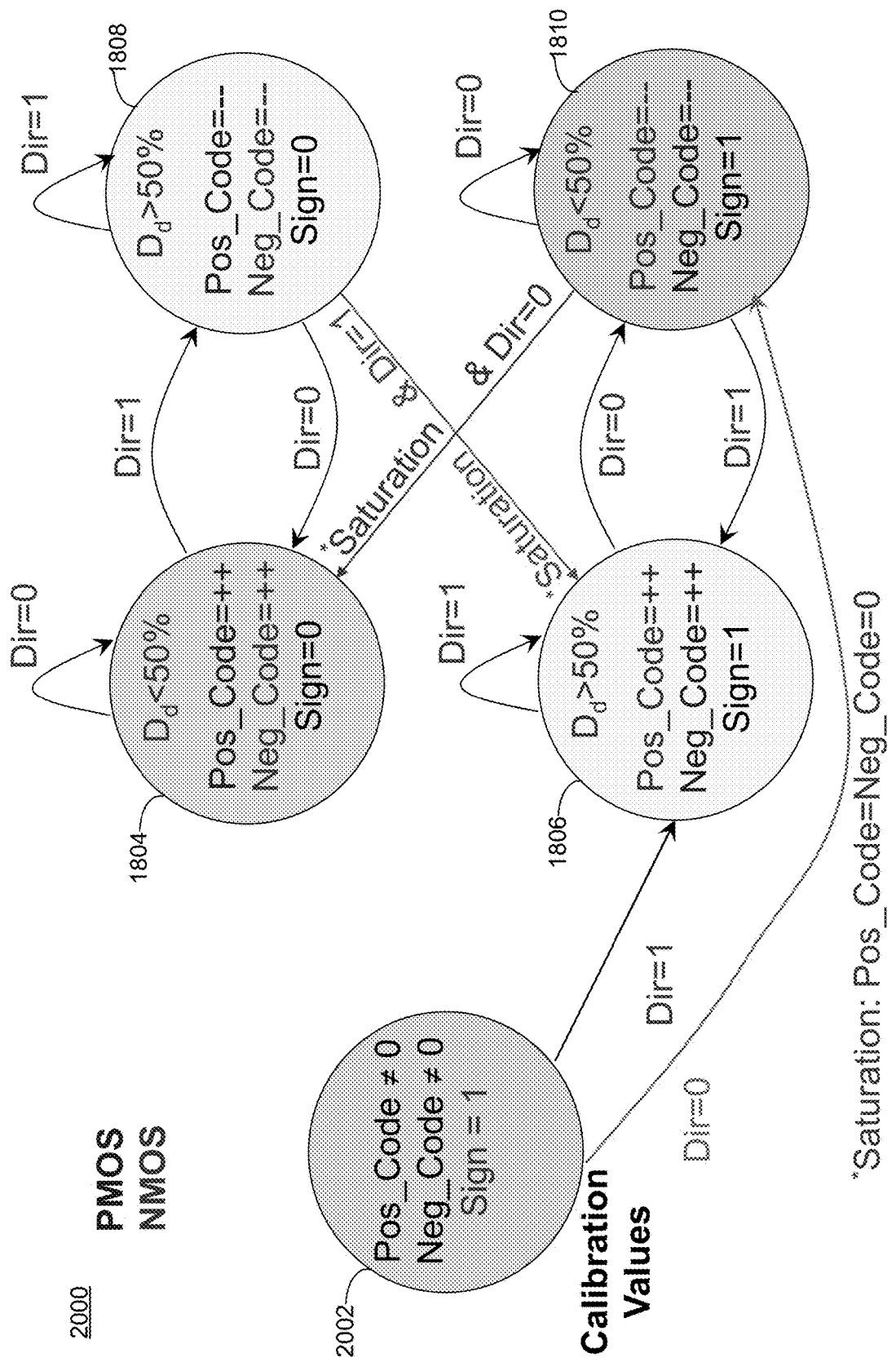
FIG. 20 is a state diagram depicting an embodiment of a maintenance mode of the at least one set of inverters in accordance with the present disclosure.

Referring to the example state diagrams of FIGS. 19 and 20, after obtaining a duty cycle of e.g., 50%, the controller circuit may enter a maintenance mode to maintain the duty cycle at approximately e.g., 50%. When the "Sign" signal is "0", the controller circuit may enter maintenance mode at state 1902 as shown in FIG. 19. While in state 1902, the values for the Pos_Code and Neg_Code signals for the at least one set of inverters may be non-zero. If the "Dir" signal is "0" (i.e., the duty cycle drops below 50% by a threshold), the controller circuit may advance to state 1804 and proceed as discussed above relative to FIG. 18. If the "Dir" signal is "1" (i.e., the duty cycle rises above 50% by a threshold), the controller circuit may advance to state 1808 and proceed as discussed above relative to FIG. 18.

In some embodiments and after entering maintenance mode when the "Sign" signal is "1", the controller circuit may enter state 2002 as shown in FIG. 20. While in state 2002, the values for the Pos_Code and Neg_Code signals for the at least one set of inverters may be non-zero. If the "Dir" signal is "0" (i.e., the duty cycle drops below 50% by a threshold), the controller circuit may advance to state 1810 and proceed as discussed above relative to FIG. 18. If the "Dir" signal is "1" (i.e., the duty cycle rises above 50% by a threshold), the controller circuit may advance to state 1806 and proceed as discussed above relative to FIG. 18.

Figure 21:
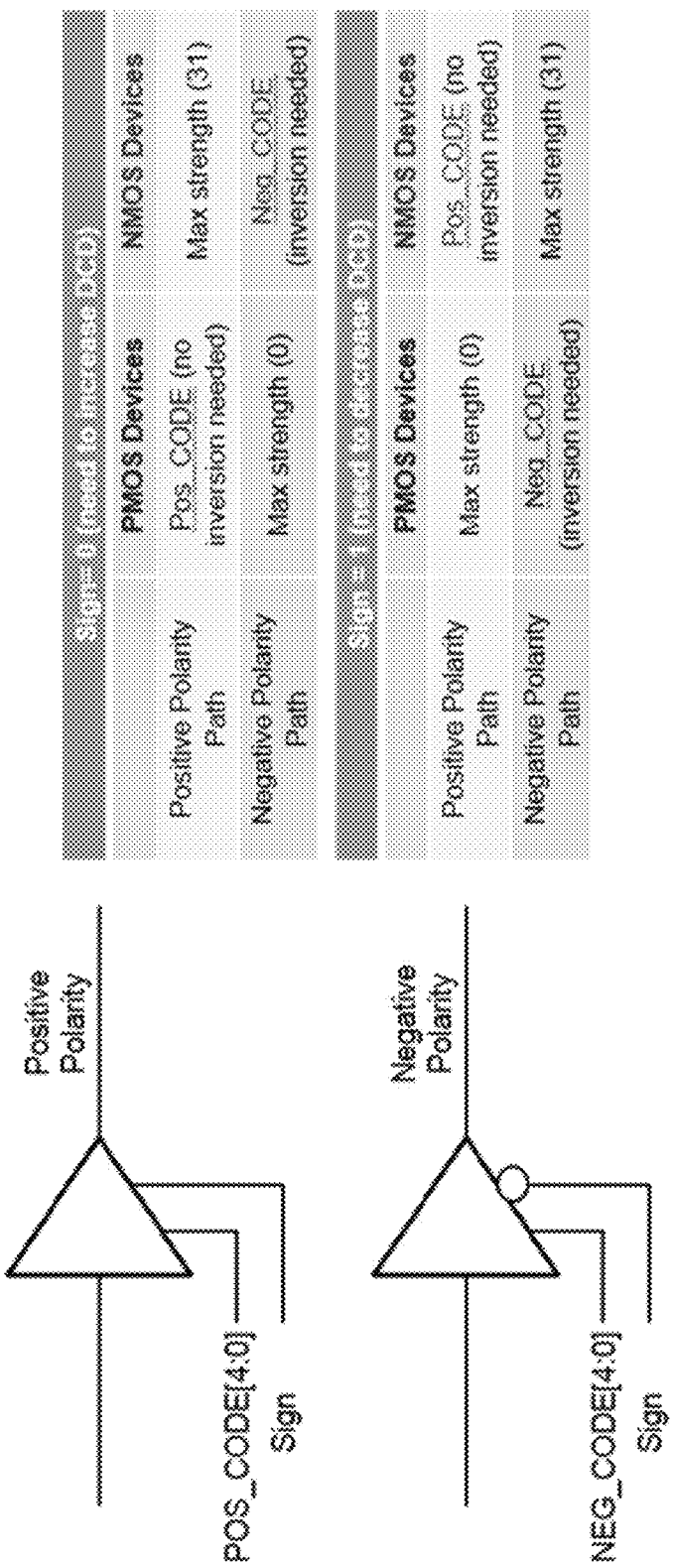
FIG. 21 is a diagram depicting an embodiment of control codes in accordance with the present disclosure.

Returning to the example of FIG. 9 and in some embodiments, controller circuit 722 may provide a Pos_Code signal for a set of inverters of a positive polarity path (e.g., set of inverters 902); a Neg_Code signal for a set of inverters of a negative polarity path (e.g., set of inverters 904); and a Sign signal for each set of inverters. As discussed above, Pos_Code and Neg_Code may be unsigned magnitudes ranging from zero to e.g., 31, where a zero value indicates that the least correction is necessary and a maximum value (e.g., 31) indicates that the most correction is necessary. As shown in FIG. 21, when the Sign signal is "0", a larger code value (e.g., Pos_Code and Neg_Code values) indicates a smaller differential duty cycle and when the Sign signal is "1", a larger code value (e.g., Pos_Code and Neg_Code values) indicates a larger differential duty cycle. As described above in the state diagrams of FIGS. 18-20, the Pos_Code and Neg_Code value may be specifically applied to various transistors based on the value of the Sign signal. For example, a duty cycle correction circuit may include a decoder (e.g., decoders 906, 908) to convert the Pos_Code signal, the Neg_Code signal, and the Sign signal to control signals specific to the plurality of transistors within the set of inverters. For example, when Sign="0", PMOS transistors may receive the value of Pos_Code and the NMOS transistors may receive the value of Neg_Code. When Sign="1", NMOS transistors may receive the value of Pos_Code and the PMOS transistors may receive the value of Neg_Code. As discussed above, these values may control the pull-up and/or pull-down of each transistor to provide a step in the correction of the signal duty cycle. While the above state diagrams present an exemplary process for correcting the duty cycle of at least one signal, it will be appreciated that there are various processes or methodologies that may be employed within the scope of the present disclosure.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. An apparatus for correcting a duty cycle of at least one signal, comprising:
at least one set of inverters configured to:
receive the at least one signal;
correct the duty cycle of the at least one signal at a correction location of a plurality of correction locations based upon, at least in part, a transmission rate mode of a plurality of transmission rate modes, wherein each of the plurality of correction locations include a comparator; and
a plurality of inverters in parallel with the at least one set of inverters, wherein the plurality of inverters are configured to:
provide a configurable duty cycle correction range, wherein disabling at least a portion of the plurality of inverters increases the duty cycle correction range and enabling at least a portion of the plurality of inverters decreases the duty cycle correction range.

2. The apparatus of claim 1, wherein the at least one set of inverters includes one or more of:
at least one three-state inverter cell comprising a plurality of NMOS and PMOS transistors; and
at least one nine-state inverter cell comprising a plurality of NMOS and PMOS transistors.

3. The apparatus of claim 1, wherein the at least one set of inverters is configured to correct the at least one output signal at a first correction location during a first transmission rate mode.

4. The apparatus of claim 3, wherein the first correction location is at an output of the at least one set of inverters and the first transmission rate mode is a non-half-rate transmission mode.

5. The apparatus of claim 1, wherein the at least one set of inverters is configured to correct the at least one output signal at a second correction location during a second transmission rate mode.

6. The apparatus of claim 5, wherein the second correction location is at an input of a transmitter circuit electrically coupled to the at least one set of inverters and the second transmission rate mode is a half-rate transmission mode.

7. The apparatus of claim 1, further comprising:
a controller circuit configured to provide one or more control signals to the at least one set of inverters to correct the duty cycle of the at least one signal at the correction location based upon, at least in part, the transmission rate mode.

8. The apparatus of claim 7, wherein the controller circuit is configured to be placed into a hold state for maintaining the value of the one or more control signals.

9. The apparatus of claim 7, wherein the at least one set of inverters and the controller circuit defines a digital feedback loop.

10. A method for correcting a duty cycle of at least one signal, comprising:
receiving, via at least one set of inverters, the at least one signal;
correcting, via the at least one set of inverters, the duty cycle of the at least one signal at a correction location of a plurality of correction locations based upon, at least in part, a transmission rate mode of a plurality of transmission rate modes, wherein each of the plurality of correction locations include a comparator; and
providing, via a plurality of inverters in parallel with the at least one set of inverters, a configurable duty cycle correction range; and
one or more of:
disabling at least a portion of the plurality of inverters, wherein disabling the at least a portion of the plurality of inverters increases the duty cycle correction range; and enabling at least a portion of the plurality of inverters, wherein enabling the at least a portion of the plurality of inverters decreases the duty cycle correction range.

11. The method of claim 10, wherein the at least one set of inverters includes one or more of:
   at least one three-state inverter cell comprising a plurality of NMOS and PMOS transistors; and
   at least one nine-state inverter cell comprising a plurality of NMOS and PMOS transistors.

12. The method of claim 10, wherein the at least one set of inverters is configured to correct the at least one output signal at a first correction location during a first transmission rate mode.

13. The method of claim 12, wherein the first correction location is an output of the at least one set of inverters and the first transmission rate mode is a non-half-rate transmission mode.

14. The method of claim 10, wherein the at least one set of inverters is configured to correct the at least one output signal at a second correction location during a second transmission rate mode.

15. The method of claim 14, wherein the second correction location is at an input of a transmitter circuit electrically coupled to the at least one set of inverters and the second transmission rate mode is a half-rate transmission mode.

16. The method of claim 11, further comprising:
   receiving, at a controller circuit, at least one output signal from the at least one set of inverters; and
   providing, via the controller circuit, one or more control signals to the at least one nine-state inverter cell to correct the duty cycle of the at least one signal.

17. The method of claim 16, wherein the controller circuit is configured to be placed into a hold state for maintaining the value of the one or more control signals.

18. The method of claim 16, wherein the at least one set of inverters and the controller circuit defines a digital feedback loop.

19. An apparatus for correcting a duty cycle of at least one signal, comprising:
   at least one set of inverters connected in parallel configured to:
   receive the at least one signal; and
   correct the duty cycle of the at least one signal at a correction location of a plurality of correction locations based upon, at least in part, a transmission rate mode of a plurality of transmission rate modes, wherein each of the plurality of correction locations include a comparator.

* * * * *